(12) United States Patent
Wildes

(10) Patent No.: US 9,196,755 B2
(45) Date of Patent: Nov. 24, 2015

(54) SUPPORT MEMBER FOR MOUNTING PHOTOVOLTAIC MODULES AND MOUNTING SYSTEM INCLUDING THE SAME

(71) Applicant: Ecolibrium Solar, Inc., Athens, OH (US)

(72) Inventor: Brian James Wildes, Boulder, CO (US)

(73) Assignee: Ecolibrium Solar, Inc., Athens, OH (US)

( * ) Notice: Subject to any disclaimer, the term of this patent is extended or adjusted under 35 U.S.C. 154(b) by 0 days.

(21) Appl. No.: 14/521,951

(22) Filed: Oct. 23, 2014

(65) Prior Publication Data

US 2015/0040969 A1 Feb. 12, 2015

Related U.S. Application Data

(63) Continuation-in-part of application No. 13/923,303, filed on Jun. 20, 2013, now Pat. No. 8,869,471, which is a continuation-in-part of application No. 13/273,525, filed on Oct. 14, 2011, now Pat. No. 8,635,818.

(Continued)

(51) Int. Cl.
*E04H 14/00* (2006.01)
*H01L 31/02* (2006.01)
(Continued)

(52) U.S. Cl.
CPC ......... *H01L 31/02008* (2013.01); *F24J 2/5237* (2013.01); *F24J 2/5239* (2013.01);
(Continued)

(58) Field of Classification Search
CPC .......... H02S 2/00; Y02B 10/12; Y02B 10/20; Y02E 10/50

USPC .......... 52/173.3; 126/621, 622, 623; 136/251, 136/259, 244, 246; 248/237
See application file for complete search history.

(56) References Cited

U.S. PATENT DOCUMENTS

| 4,677,248 A | 6/1987 | Lacey |
| 5,092,939 A | 3/1992 | Nath et al. |

(Continued)

FOREIGN PATENT DOCUMENTS

| DE | 202011001411 U1 | 4/2011 |
| EP | 2362161 A1 | 8/2011 |

(Continued)

OTHER PUBLICATIONS

PCT Form 210, International Search Report for PCT/US2012/060032, mailed on Mar. 18, 2013.

(Continued)

*Primary Examiner* — Mark Wendell
(74) *Attorney, Agent, or Firm* — The Law Office of Patrick F. O'Reilly III, LLC

(57) ABSTRACT

A support member for mounting photovoltaic modules on a support surface and a mounting system including the same are disclosed herein. The support member may comprise a body portion that includes a ballast receiving portion for accommodating one or more ballasts, the body portion further including a first support portion with a first surface and a second support portion with a second surface, the first support portion being spaced apart from the second support portion by the ballast receiving portion. The support member is configured to bridge a plurality of rows of photovoltaic modules, the first surface of the support member configured to support one or more photovoltaic modules in a first row of the plurality of rows of photovoltaic modules, and the second surface of the support member configured to support one or more photovoltaic modules in a second row of the plurality of rows of photovoltaic modules.

20 Claims, 25 Drawing Sheets

Related U.S. Application Data

(60) Provisional application No. 61/690,974, filed on Jul. 10, 2012, provisional application No. 61/447,883, filed on Mar. 1, 2011.

(51) Int. Cl.

| | | |
|---|---|---|
| *H01L 31/042* | (2014.01) | |
| *F24J 2/52* | (2006.01) | |
| *H02S 20/24* | (2014.01) | |
| *H02S 20/10* | (2014.01) | |

(52) U.S. Cl.
CPC .............. *F24J 2/5258* (2013.01); *F24J 2/5264* (2013.01); *H02S 20/00* (2013.01); *H02S 20/10* (2014.12); *H02S 20/24* (2014.12); *F24J 2002/5224* (2013.01); *F24J 2002/5292* (2013.01); *Y02B 10/12* (2013.01); *Y02B 10/20* (2013.01); *Y02E 10/47* (2013.01); *Y02E 10/50* (2013.01)

(56) References Cited

U.S. PATENT DOCUMENTS

| | | |
|---|---|---|
| 5,746,839 A | 5/1998 | Dinwoodie |
| 6,105,316 A | 8/2000 | Bottger et al. |
| 6,148,570 A | 11/2000 | Dinwoodie et al. |
| 6,331,671 B1 | 12/2001 | Makita et al. |
| 6,360,491 B1 | 3/2002 | Ullman |
| 6,672,018 B2 | 1/2004 | Shingleton |
| D510,315 S | 10/2005 | Shugar et al. |
| 6,959,517 B2 | 11/2005 | Poddany et al. |
| D519,444 S | 4/2006 | Mascolo |
| D547,262 S | 7/2007 | Ullman |
| D560,605 S | 1/2008 | McClintock et al. |
| D564,958 S | 3/2008 | Almy et al. |
| D565,505 S | 4/2008 | Shugar et al. |
| 7,435,134 B2 | 10/2008 | Lenox |
| 7,476,832 B2 | 1/2009 | Vendig et al. |
| D586,737 S | 2/2009 | Shugar et al. |
| 7,492,120 B2 | 2/2009 | Benn et al. |
| D598,372 S | 8/2009 | Sasada |
| 7,780,472 B2 | 8/2010 | Lenox |
| 8,136,311 B2 | 3/2012 | Liu |
| 8,191,320 B2 | 6/2012 | Mittan et al. |
| 8,266,848 B2 | 9/2012 | Miros et al. |
| 8,276,330 B2 | 10/2012 | Harberts et al. |
| 8,397,448 B2 | 3/2013 | Brown et al. |
| 8,424,255 B2 | 4/2013 | Lenox et al. |
| 8,505,864 B1 | 8/2013 | Taylor et al. |
| D692,372 S | 10/2013 | Rothschild et al. |
| 2005/0072456 A1 | 4/2005 | Stevenson et al. |
| 2005/0166955 A1 | 8/2005 | Nath et al. |
| 2007/0095388 A1 | 5/2007 | Mergola et al. |
| 2007/0144575 A1 | 6/2007 | Mascolo et al. |
| 2007/0151594 A1 | 7/2007 | Mascolo et al. |
| 2009/0019796 A1 | 1/2009 | Liebendorfer |
| 2009/0134291 A1 | 5/2009 | Meier et al. |
| 2009/0242014 A1 | 10/2009 | Leary |
| 2009/0320904 A1 | 12/2009 | Botkin et al. |
| 2009/0320905 A1 | 12/2009 | Botkin et al. |
| 2009/0320906 A1 | 12/2009 | Botkin et al. |
| 2009/0320907 A1 | 12/2009 | Botkin et al. |
| 2010/0154780 A1 | 6/2010 | Linke |
| 2010/0212714 A1 | 8/2010 | Rothschild et al. |
| 2010/0219304 A1 | 9/2010 | Miros et al. |
| 2010/0269428 A1 | 10/2010 | Stancel et al. |
| 2011/0056536 A1 | 3/2011 | Meppelink et al. |
| 2011/0154774 A1 | 6/2011 | Rawlings |
| 2011/0179727 A1 | 7/2011 | Liu |
| 2011/0278411 A1 | 11/2011 | Carbonare et al. |
| 2012/0031473 A1 | 2/2012 | Chan et al. |
| 2012/0032045 A1 | 2/2012 | Lallier et al. |
| 2012/0266944 A1 | 10/2012 | Wildes |
| 2013/0032208 A1 | 2/2013 | Walz et al. |

FOREIGN PATENT DOCUMENTS

| | | |
|---|---|---|
| FR | 2957619 A1 | 9/2011 |
| GB | 801367 A | 9/1958 |
| JP | 07018795 A | 1/1995 |
| JP | 09177272 A | 7/1997 |
| JP | 2001291889 A | 10/2001 |
| JP | 2008214875 A | 9/2008 |
| WO | 2005020290 A2 | 3/2005 |
| WO | 2008/105296 A1 | 9/2008 |
| WO | 2009120923 A2 | 10/2009 |

OTHER PUBLICATIONS

PCT Form 237, Written Opinion of the International Searching Authority for PCT/US2012/060032, mailed on Mar. 18, 2013.

First office action on the merits (Non-Final Rejection) in U.S. Appl. No. 13/273,525, sent on Mar. 21, 2013.

Notice of Allowance in U.S. Appl. No. 13/273,525, mailed on Sep. 12, 2013.

First office action on the merits (Non-Final Rejection) in U.S. Appl. No. 13/923,303, mailed on Sep. 20, 2013.

First office action on the merits (Non-Final Rejection) in U.S. Appl. No. 13/923,342, mailed on Sep. 17, 2013.

PCT Form 210, International Search Report for PCT/US2013/049851, mailed on Nov. 7, 2013.

PCT Form 237, Written Opinion of the International Searching Authority for PCT/US2013/049851, mailed on Nov. 7, 2013.

Supplemental Notice of Allowance in U.S. Appl. No. 13/273,525, mailed on Dec. 11, 2013.

European Search Report from the European Patent Office for European Patent Appl. No. EP 12 840 607.1, mailed on May 11, 2015.

Written Opinion from the European Patent Office for European Patent Appl. No. EP 12 840 607.1, mailed on May 11, 2015.

SUPPORT MEMBER FOR MOUNTING PHOTOVOLTAIC MODULES AND MOUNTING SYSTEM INCLUDING THE SAME

CROSS-REFERENCE TO RELATED APPLICATIONS

The present application is a continuation-in-part of U.S. application Ser. No. 13/923,303, filed on Jun. 20, 2013, which claims the benefit of U.S. provisional application No. 61/690,974, filed Jul. 10, 2012, and is a continuation-in-part of U.S. application Ser. No. 13/273,525, filed Oct. 14, 2011, which claims the benefit of U.S. provisional application No. 61/447,883, filed Mar. 1, 2011, all of the disclosures of which are herein expressly incorporated by reference in their entirety.

STATEMENT REGARDING FEDERALLY SPONSORED RESEARCH OR DEVELOPMENT

Not Applicable.

NAMES OF THE PARTIES TO A JOINT RESEARCH AGREEMENT

Not Applicable.

REFERENCE TO APPENDIX

Not Applicable.

FIELD OF THE INVENTION

The field of the present invention generally relates to mounting systems and methods and, more particularly, to systems and methods for mounting photovoltaic modules or panels on support surfaces such as, for example, building rooftops, the ground, or the like.

BACKGROUND OF THE INVENTION

A photovoltaic (PV) panel, often referred to as a solar panel or PV module, is a packaged interconnected assembly of solar cells also known as PV cells. The PV module is typically used as a component of a larger PV system to generate and supply electricity in commercial and residential applications. Because a single PV module can only produce a limited amount of power, most installations contain several PV modules to form a PV array. The PV array is often mounted on a building rooftop or the ground with each of the PV modules in a fixed position facing generally south.

There are many mounting systems for securing PV modules to rooftops that adequately withstand wind loads. However, these prior mounting systems are not environmentally friendly, are relatively expensive to produce, time consuming to install, custom fabricated to each type or brand of PV module, and/or can damage the rooftop by penetrating a roof membrane. Accordingly, there is a need in the art for improved mounting systems for PV modules in rooftop applications.

SUMMARY OF THE INVENTION

Disclosed are mounting systems and methods that overcome at least one of the disadvantages of the related art described above. Disclosed is a mounting system for photovoltaic modules, which includes a plurality of separate support members supporting and orienting the photovoltaic modules in an array, the array including one or more rows of photovoltaic modules. Each of the photovoltaic modules is supported by at least four of the support members, and each of the support members is secured to and supports only one of the photovoltaic modules in each of the one or more rows of photovoltaic modules.

Also disclosed is a support member for supporting one or more photovoltaic modules on a support surface, which includes a body portion, the body portion including a ballast receiving portion for accommodating one or more ballasts, the body portion further including a first support portion with a first surface and a second support portion with a second surface, the first support portion being spaced apart from the second support portion by the ballast receiving portion. The support member is configured to bridge a plurality of rows of photovoltaic modules, the first surface of the support member being configured to support one or more photovoltaic modules in a first row of the plurality of rows of photovoltaic modules, and the second surface of the support member being configured to support one or more photovoltaic modules in a second row of the plurality of rows of photovoltaic modules.

Also disclosed is a photovoltaic system mounted on a support surface, which includes a plurality of rectangular-shaped photovoltaic modules; and a plurality of separate and spaced-apart support members supporting and orienting the photovoltaic modules in an array on the support surface without penetrating the support surface, the array including a plurality of rows of photovoltaic modules, each of the support members having a body portion, the body portion including a ballast receiving portion for accommodating one or more ballasts, the body portion further including at least one hollow support member coupled to the ballast receiving portion, and at least one of the plurality of support members further including integrated grounding means, the integrated grounding means configured to provide integrated grounding between adjacent photovoltaic modules. At least one of the plurality of support members bridges a first row of the plurality of rows of photovoltaic modules and a second row of the plurality of rows of photovoltaic modules.

From the foregoing disclosure and the following more detailed description of various preferred embodiments it will be apparent to those skilled in the art that the present invention provides a significant advance in the technology and art of mounting systems. Particularly significant in this regard is the potential the invention affords for a device that is universal, environmentally friendly, relatively inexpensive to produce and is easy to use. Additional features and advantages of various preferred embodiments will be better understood in view of the detailed description provided below.

BRIEF DESCRIPTION OF THE DRAWINGS

These and further features of the present invention will be apparent with reference to the following description and drawings, wherein.

Figure 6:
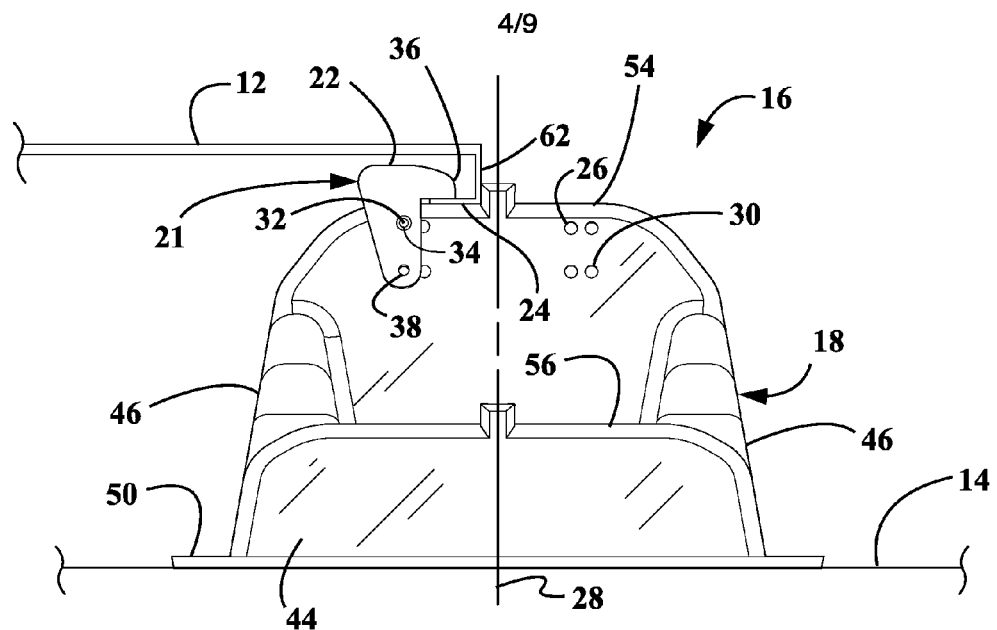
FIG. 6 is a rear elevational view of the support member of FIGS. 3 to 5.

It should be understood that the appended drawings are not necessarily to scale, presenting a somewhat simplified representation of various preferred features illustrative of the basic principles of the invention. The specific design features of the mounting systems as disclosed herein, including, for example, specific dimensions and shapes of the various components will be determined in part by the particular intended application and use environment. Certain features of the illustrated embodiments have been enlarged or distorted relative to others to facilitate visualization and clear understanding. In particular, thin features may be thickened, for example, for clarity or illustration. All references to direction and position, unless otherwise indicated, refer to the orientation of the mounting systems illustrated in the drawings. In general, up or upward refers to an upward direction within the plane of the paper in FIG. 6 and down or downward refers to a downward direction within the plane of the paper in FIG. 6. In general, front or forward refers to a direction towards the south and towards the left within the plane of the paper in FIG. 1 and rear or rearward refers to a direction towards the north and towards the right within the plane of the paper in FIG. 1.

DETAILED DESCRIPTION OF CERTAIN PREFERRED EMBODIMENTS

It will be apparent to those skilled in the art, that is, to those who have knowledge or experience in this area of technology, that many uses and design variations are possible for the improved mounting systems and methods disclosed herein. The following detailed discussion of various alternative and preferred embodiments will illustrate the general principles of the invention with regard to the specific application of rooftop mounted photovoltaic (PV) modules that are in the form of rectangular-shaped panels. Other embodiments suitable for other applications will be apparent to those skilled in the art given the benefit of this disclosure such as for example, ground mounted PV modules and/or PV modules having different shapes.

Figure 1:
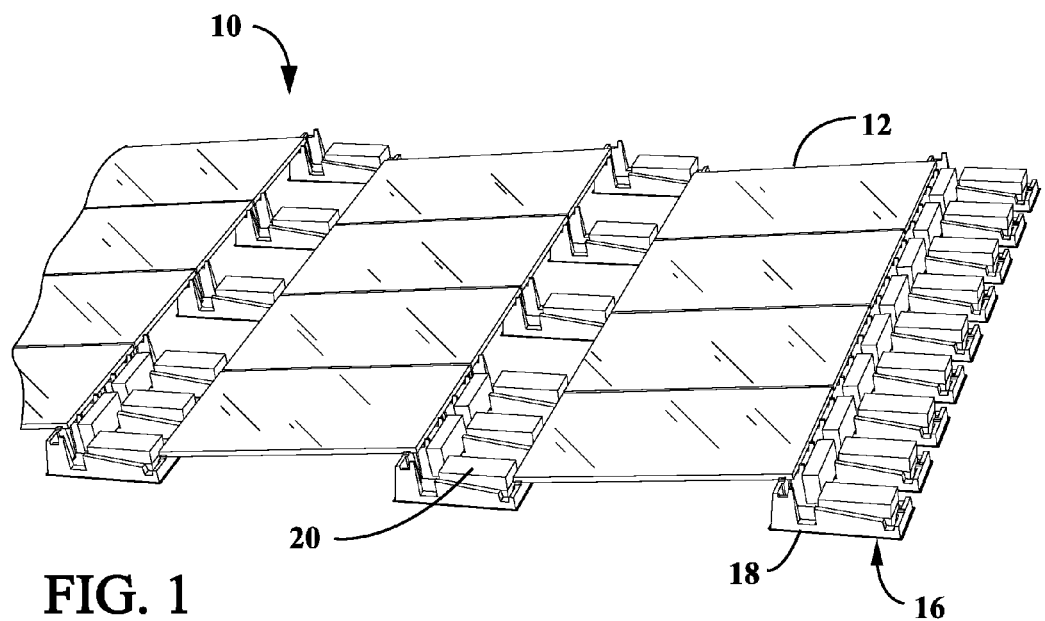
FIG. 1 is a perspective view of an array of photovoltaic (PV) modules utilizing a mounting system according to a first embodiment of the present invention, wherein each of the PV modules is supported in a portrait orientation.
Figure 2:
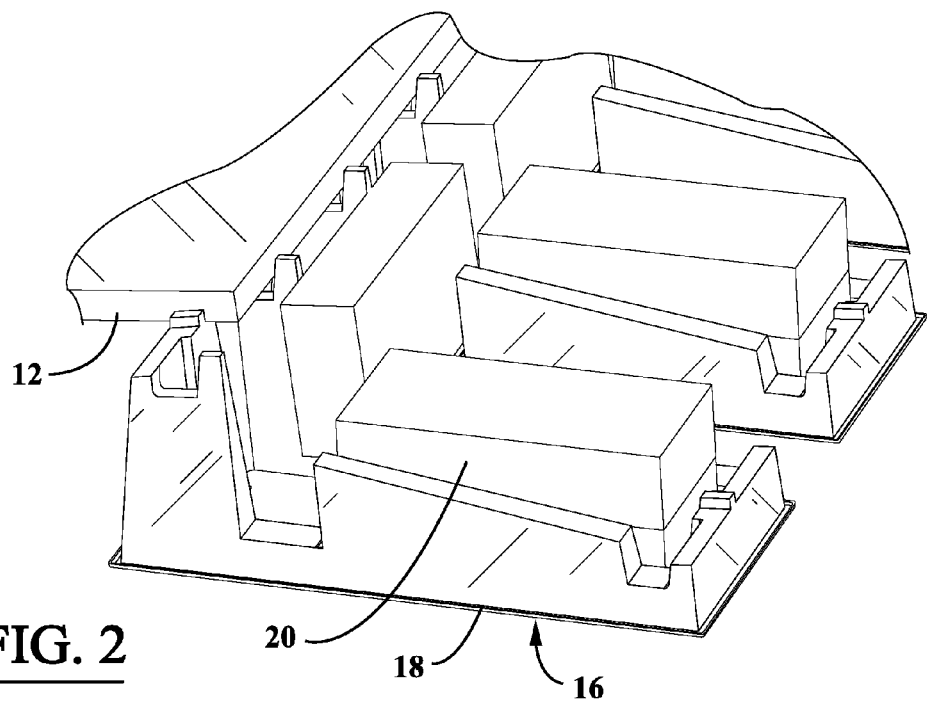
FIG. 2 is an enlarged perspective view of a portion of FIG. 1, showing support members of the mounting system.
Figure 3:
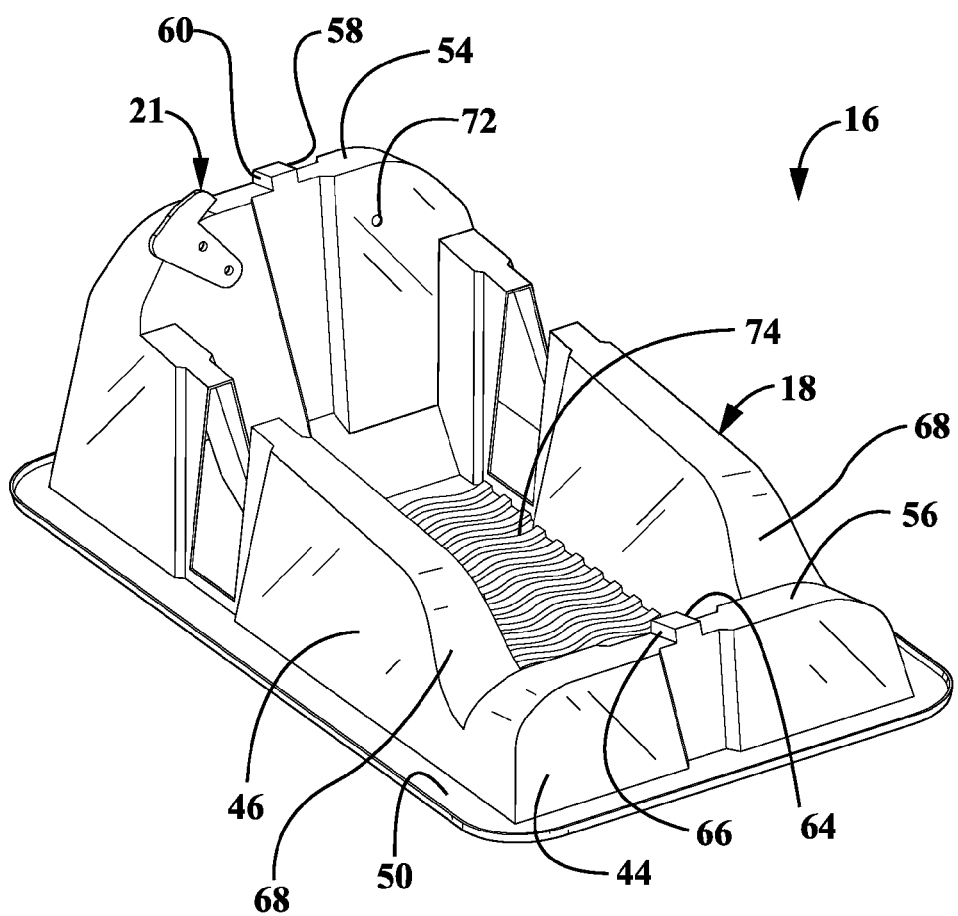
FIG. 3 is a top/rear perspective view of a support member that is used in conjunction with the PV array of FIG. 1.
Figure 4:
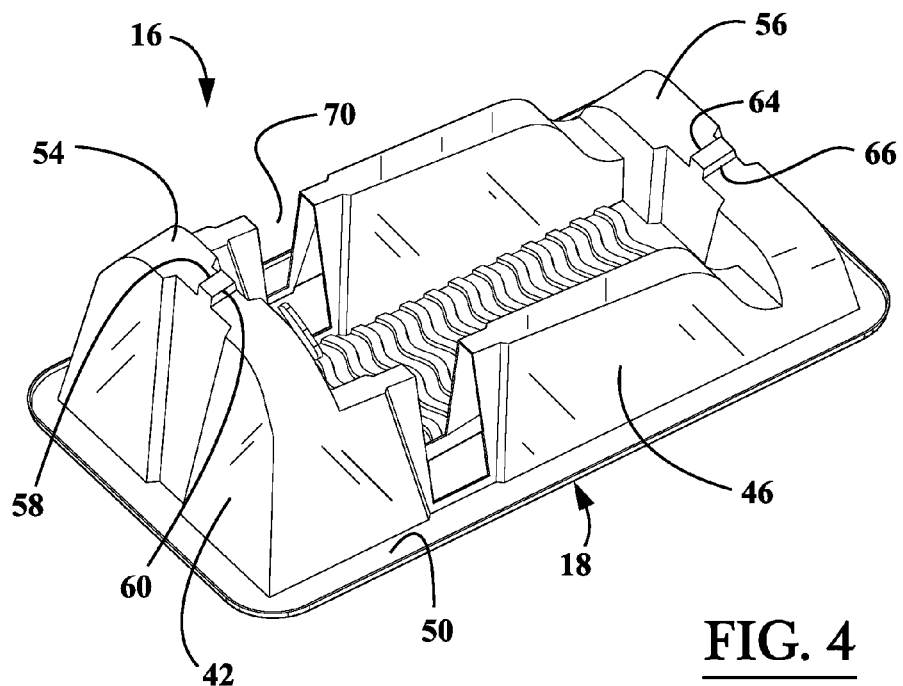
FIG. 4 is a top/front perspective view of the support member of FIG. 3.
Figure 5:
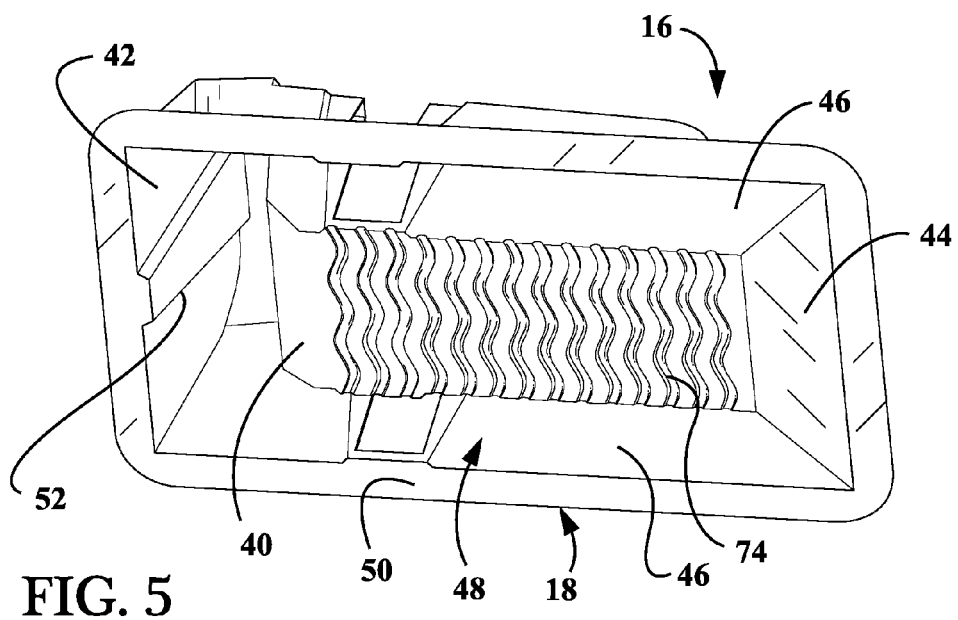
FIG. 5 is a bottom perspective view of the support member of FIGS. 3 and 4.

FIGS. 1 and 2 illustrate a photovoltaic system 10 according to a first embodiment of the present invention. The illustrated photovoltaic system or array 10 includes an array of solar panels or PV modules 12 mounted to a substantially flat support surface 14 (pitch range of about 0 degrees to about 5 degrees—see e.g., FIG. 6) in the form of a building rooftop 14 by a mounting system or assembly 16 according to the present invention. The illustrated mounting system 16 includes a plurality of support members 18 that rest on the support surface 14 and support and orient the PV modules 12 above the support surface 14 and a plurality of ballasts 20 in the form of ballast blocks that weight the support members 18 to the support surface 14 to maintain the position of the support members 18 on the support surface 14. The illustrated PV array 10 has each of the rectangular shaped PV modules 12 oriented in a portrait orientation, that is, with the longest axis of the PV modules 12 extending in a forward-rearward direction which is typically the south-north direction. It is noted, however, that the PV modules 12 can alternatively be oriented by the support members 18 in a landscape orientation, that is, with the longest axis of the PV modules 12 extending in a lateral or side-to-side direction which is typically the east-west direction (see FIG. 7). In either the portrait or landscape orientations, the illustrated PV modules are supported in an inclined position such that the forward end of each PV module 12 is positioned lower than its rearward end so that typically the southern end is positioned lower than the northern end.

Each illustrated PV module 12 is supported by a plurality of the support members 18. At least three of the support members 18 must be utilized for each of the PV modules 12 in order to establish a desired plane for the PV modules 12. For the illustrated rectangular-shaped PV modules 12, at least four of the support members 18 are preferably utilized to support each of the PV modules so that they can be positioned at or near each corner of the rectangular-shaped PV modules 12. Each support member 18 supports at least one of the PV modules 12 but some of the illustrated support members 18 support more than one of the PV modules 12. The illustrated PV modules 12 are secured to the support members 18 (as described in more detail hereinafter) but each the support members 18 is not directly secured to any of the other support members 18. It is noted that while there is not a direct structural connection between the support members 18, the support members 18 are indirectly connected by the PV modules 12 in a structural manner. That is, they are connected in a load carrying manner. It is noted that non-load bearing components such as wind shields and the like can also be supported by the support members 18 as discussed in more detail hereinafter. Thus, the support members 18 are only structurally connected to one another through the PV modules 12. Securing the support members 18 at or near the corners of PV modules 12, and not directly connected to one another, allows the mounting system 16 to be used with PV modules 12 of any width and length without requiring customization or modification to the support members 18 or the PV modules 12. Thus a common support member 18 can be used in many applications to mount many different models of PV modules 12. Also, the illustrated support members 18 are not fastened to the support surface 14 and simply rest on the support surface 14 as they are weighted in place by the ballast 20. Therefore the support members 18 do not penetrate the roof membrane of the support surface 14.

The illustrated mounting system 16 has the flexibility to be configured to add resistance to wind loads at most installation sites. To further resist winds from the north which create the greatest need for ballast weight, one or more of the support members 18 can be placed in between the support members 18 at the corners of the PV module 12 to add additional ballast 20 and block wind from blowing underneath the PV module to create uplift. The additional support member also creates the ability for ballast 20 in the form of a concrete block to be placed on its side and straddling two of the support members 18 to further create a wind barrier which prevents wind from blowing underneath the PV module 12 to create uplift. The illustrated PV array 10 shows that support members and straddling ballast 20 can be utilized to fully block the rearward end of the PV array 10 (see e.g., FIG. 1).

As shown in FIGS. 3 to 6, each of the illustrated support members 18 can be quickly and removably attached to the PV module 12 without tools using an attachment system 21. The illustrated attachment system 21 is in the form of pivoting hooks 22. In the illustrated embodiment, up to four pivoting hooks 22 can be secured at the forward end and the rearward end of the support member 18. The illustrated hooks 22 are adapted to engage and secure a lower flange 24 of the PV module 12. Both ends of the illustrated support member 18 are provided with a pair of laterally spaced-apart upper holes 26 on each side of the support member centerline 28 so that the hooks 22 can be located to engage PV module flanges 24 in both directions and having a variety of different widths so that customization of the flange 24, hook 22, or support member 18 is not required. Both ends of the illustrated support member 18 are also provided with a pair of laterally spaced apart lower holes 30 on each side of the support member centerline 28 for attachment of the hooks 22. More than two holes 26, 30 can be utilized if it is desired to accommodate a wider variety of widths for the PV module lower flange 24. It is noted that any other suitable quantity and/or locations for the openings 26, 30 can be utilized depending on how much flexibility in positioning the hooks 22 is desired.

To secure the PV module 12 to the illustrated support member 18, the hook 22 is first attached to the support member 18 by inserting a first removable fastener 32 through an upper hole 34 of the hook 22 and into one of the upper holes 26 in the support member 18 so that the hook 22 is pivotably secured to the support member 18. That is, the hook 22 is pivotable relative to the support member 18 about the rivet 32. The illustrated fastener 32 is a plastic push rivet. Suitable plastic push rivets include TR and TRM rivets available from Richco Inc. of Morton Grove, Ill. It is noted that any other suitable fasteners 32 can alternatively be utilized in place of the illustrated push rivets 32. With the hook 22 pivotably attached to the support member 18, the PV module 12 is placed onto the support member 18 and the PV module 12 is secured to the support member 18 by pivoting the hook 22 about the rivet (clockwise in FIG. 6) until the hook 22 is vertical and its hook portion 36 is above and pressing down on the lower flange 24 of the PV module 12. A second removable fastener in the form of a plastic push rivet is inserted through a lower hole 38 of the hook 22 and into one of the lower holes 30 in the support member 18 so that the hook 22 is no longer pivotable relative to the support member 18. The illustrated attachment system is low cost, universal, quick, easy, and robust. It is noted however, that any other suitable attachment system 21 can alternatively be utilized to secure the PV modules 12 to the support members 18 if desired. For example, one alternative to the illustrated attachment system 21 is to replace the push rivet 32 with a snap-in feature or features integrally molded into the hook 22 that snaps into the upper holes 26 and/or locks into the lower holes 30 the hook 22 is being pivoted into place. Also for example, another alternative to the illustrated attachment system 21 is to replace the hook 22 with a slide mechanism that slides across the top of the support member 18 after the PV module 12 is in place to trap the PV module's lower flange 24. The slider of the slide mechanism could be held in place by snap-in features, fasteners, or the like. As an additional alternative to the illustrated attachment system 21, the hooks 22 may be replaced with one or more clamping members that include integrated grounding means.

The illustrated support member 18 is designed to be entirely comprised of plastic and can be manufactured by thermoforming by using chamfers, gussets, large radii, and large draft angles. A suitable plastic is High Molecular Weight Polyethylene (HMWPE) with UV inhibitor. It is noted however, that the support member 18 can alternatively comprise other materials and/or can be manufactured by other methods such as, for example, injection molding or the like. Plastic enables desired complex shapes to be produced at relatively low cost and has other advantages over prior art products made of aluminum, galvanized metal, and stainless steel materials. For example, plastic is rustproof, can be made with 100% recycled materials and is 100% recyclable, does not require electrical grounding, and is harmless on the roof membrane, and is low cost.

The illustrated support member 18 is formed of thin walls and includes a bottom wall 40 surrounded by hollow forward, rearward and side walls 42, 44, 46 to form a central upward facing cavity 48. The cavity 48 is sized and shaped for receiving the ballast as described in more detail hereinafter. The illustrated support member 18 includes an outer peripheral flange 50 that has an upturned outer edge or lip that is stepped slightly above the support surface 14 to prevent the edge from damaging the support surface 14 particularly when it is a thin roof membrane. These upturned edges also add strength to flange 50. The illustrated support member 18 utilizes built-in ribs 52 and a variable wall thickness to enable the support member 18 to adequately support the PV modules 12, and other loads such as large snow loads, with thin walls and low cost commodity plastics. The hollow shape and large draft angles allow for the illustrated support members 18 to be nested together when stacked to lower shipping and handling costs.

The illustrated hollow forward wall 42 forms a first or forward support surface 54 at its top and the hollow rearward wall 44 forms a second or rearward support surface 56 at its top. The first support surface 54 is sized and shaped to support the rearward ends of the PV modules 12. The second support surface 56 is sized and shaped to support the forward ends of the PV modules 12. The first support surface 54 is located at a height greater than a height of the second support surface 56 so that the PV modules 12 resting thereon are inclined. The difference in height as well as the length of the PV module 12 determines the angle of inclination of the PV module 12. The tilt angle is preferably within the range of 10 degrees to 12 degrees depending on the dimension of the PV module 12. The illustrated first and second support surfaces 54, 56 are each inclined in the same direction (downward in a forward direction) to account for the inclination of the PV modules 12. The illustrated support member 18 is sized and shaped to automatically align the PV modules 12 relative to one another when supported on the support surfaces 54, 56. The illustrated support member 18 includes various features to align the PV modules 12 in both the east/west direction (that is, the lateral direction) and the north/south direction (that is, the rearward/forward direction). By using these features to trap or prevent movement of the PV module 12 relative to the support member 18 in all directions but up and the support surfaces 54, 56 prevent downward movement of the PV module 12, the attachment system 21 only needs to keep the PV module 12 from moving up relative to the support member 18.

The illustrated first support surface 54 is provided with a centrally located wall (i.e., a PV module spacer) that forms opposed first and second abutments 58, 60 that face in laterally outward directions (that is, in directions horizontal and perpendicular to the longitudinal centerline 28 of the support member 18). With a side flange 62, which connects the lower flange 24, engaging the abutment 58, 60 the PV module 12 supported on the first support surface 54 is automatically positioned and aligned to the longitudinal centerline 28 of the support member 18. The illustrated second support surface 56 is provided with a centrally located wall (i.e., a PV module spacer) that forms opposed first and second abutments 64, 66 that face in laterally outward directions (that is, in directions horizontal and perpendicular to the longitudinal centerline 28 of the support member 18). With the side flange 62 of the PV module 12 engaging the abutment 64, 66 the PV module 12 supported on the second engagement surface 56 is automatically positioned and aligned to the longitudinal centerline 28 of the support member 18. The hollow side walls 46 form rearward facing abutments 68 at their rear ends. With the side flange 62 of the PV module 12 engaging the rear facing abutments 68, the PV module 12 supported on the second engagement surface 56 is automatically positioned and aligned in the forward/rearward direction relative to the support member 18. The illustrated abutments 68 are located near the second support surface 56 but spaced forward of the second support surface 56 (see e.g., FIG. 3).

The illustrated side walls 46 of the support member 18 have cutouts or notches 70 to hold a ballast 20 in the form of a block positioned on its side and extending laterally, either across one support member 18 or straddling two support members 18 (as described in more detail hereinafter). The illustrated notches 70 are located near the forward wall 42 but are spaced rearwardly from the forward wall 42. Positioned in this manner, the ballast 20 effectively blocks the wind and adds ballast weight, without shading any PV module 12 located to the north. An alternative to the illustrated cutouts 70 is to mold a suitable cavity for holding the ballast without cutting out the surfaces of the side walls 46.

The illustrated support members 18 also have holes 72 that accept one of many commercially available wire management clips to provide built-in wire management. Suitable wire management cable ties include WIT-40LAR and WIT-RRA available from Richco Inc. of Morton Grove, Ill. An alternative is to mold channels into the support member 18 through which wires from the PV modules 12 can be run.

The bottom surface of the illustrated bottom wall 40 has "tread" or other raised features 74 that increase the traction (or coefficient of friction) between the support member 18 and the flat support surface 14. This increased traction reduces the amount of ballast weight required to keep the support member 18 from sliding relative to the support surface 14 during wind loads. Alternatively and/or additionally, a rubber pad, feet, or the like (such as, for example EPDM) can be provided underneath the support member 18 to further increase the coefficient of friction. Another alternative is to use a double sided adhesive pad so that the support member 18 adheres to the support surface 14. Yet another alternative is to use butyl tape or the like under the support member 18 when the support surface 14 is a building rooftop so that the butyl will adhere to the rooftop surface once the temperature is high on a hot day, similar to asphalt shingles.

Each of the illustrated support members 18 can carry up to three of the ballasts 20 in the form of standard off-the-shelf, commercially available solid concrete blocks or roof pavers. The illustrated ballast blocks are of the size 4"×8"×16" and weigh about 31.5 pounds each based on ASTM Designation C1491-01a. In the illustrated embodiment, two of the ballast blocks are stacked and longitudinally extend near a rearward end of the support member 18 and one is positioned on its side and laterally extends near a forward end of the support member 18. The three illustrated ballast blocks provide about 94.5 lbs. of ballast to the support member 18. It is noted that any other suitable quantity, position and orientation of the blocks can alternatively be utilized as desired for a particular installation. For example, some of the illustrated support members 18 have two ballast blocks that are stacked and longitudinally extend near a forward end of the support member 18. It is noted that any other suitable type, shape, quantity, orientation, weight, and/or size of ballast 20 can alternatively be utilized. For example, the ballast 20 can be in the form of water bladders, sand filled containers, gravel filled containers, or the like. Advantages of water over other weight providing materials such as concrete are that it is free, easy to pump to the mounting site, safe on the roof membrane or other support surface 14, can be easily drained when decommissioning the PV array 10, and has no impact on the environment. The water bladder would be sealed to prevent evaporation and undesirable bacteria to cause a nuisance. In order to account for expansion and contraction due to freezing/thawing and temperature changes, airspace could be maintained above the water or the bladder could be flexible to expand and contract.

Figure 7:
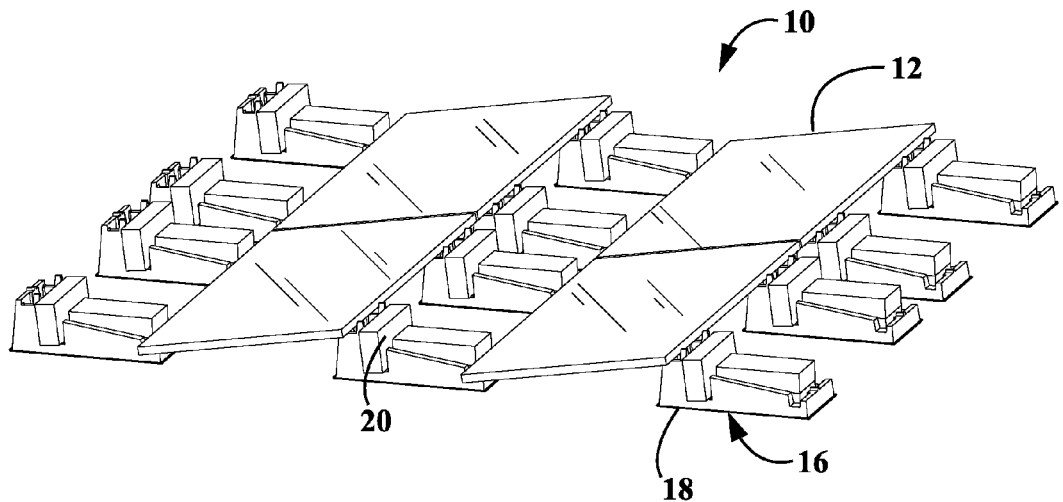
FIG. 7 is another perspective view of an alternative version of the array of PV modules shown in FIG. 1 but wherein the PV modules are secured in a different orientation.

As best shown in FIG. 7, the PV modules 12 can be mounted using the same support members 18 to mount the PV modules 12 in the landscape orientation rather than the portrait orientation. In this portrait orientation, the PV modules 12 are mounted directly to the support members 18 using an attachment system 21 utilizing mounting holes 92 provided by the manufacturer of the PV module 12 in the lower flange 24 of the PV module 12 (see FIG. 12A). A plastic push rivet is one way to fasten the PV module 12 to the support member 18 but any other suitable fastener, clamp, clip, latch or the like can alternatively be utilized. This alternative landscape orientation can be used in cases where the manufacturer of the PV module 12 requires that the mounting holes 92 of the PV module 12 be used or in cases where wind loads require weight exceeding the provisions of the portrait orientation configuration described above.

Figure 8:
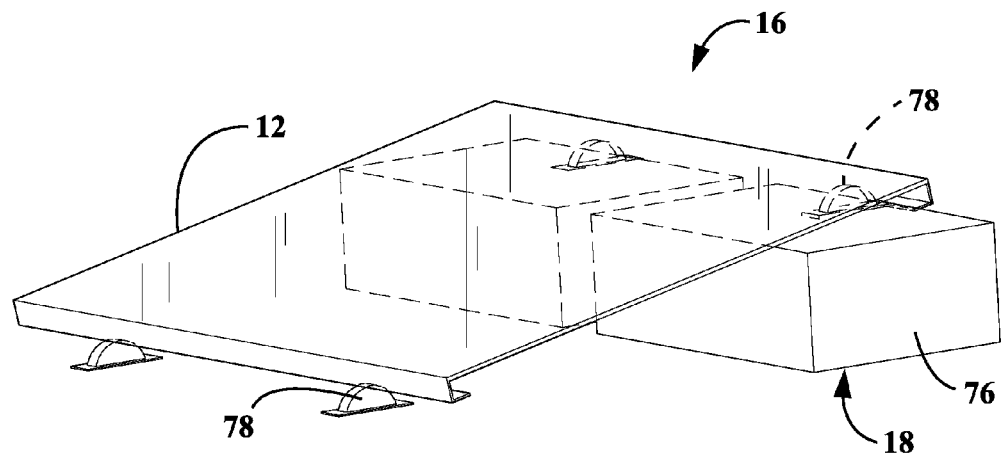
FIG. 8 is a perspective view of an array according to a second embodiment of the present invention.
Figure 11:
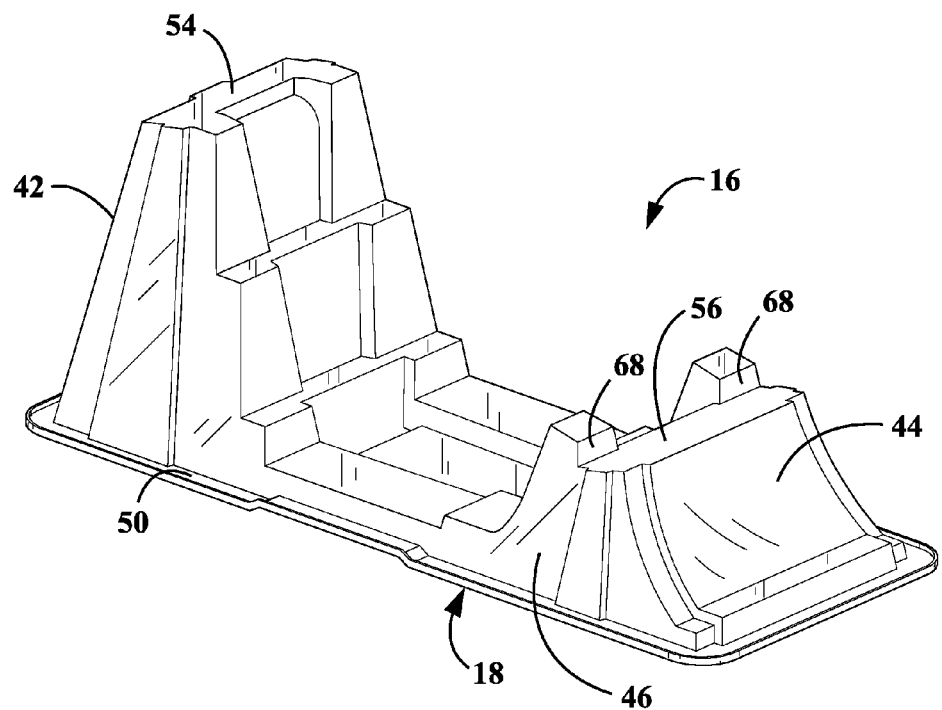
FIG. 11 is a perspective view of a support member of the array of FIGS. 9 and 10.
Figure 9:
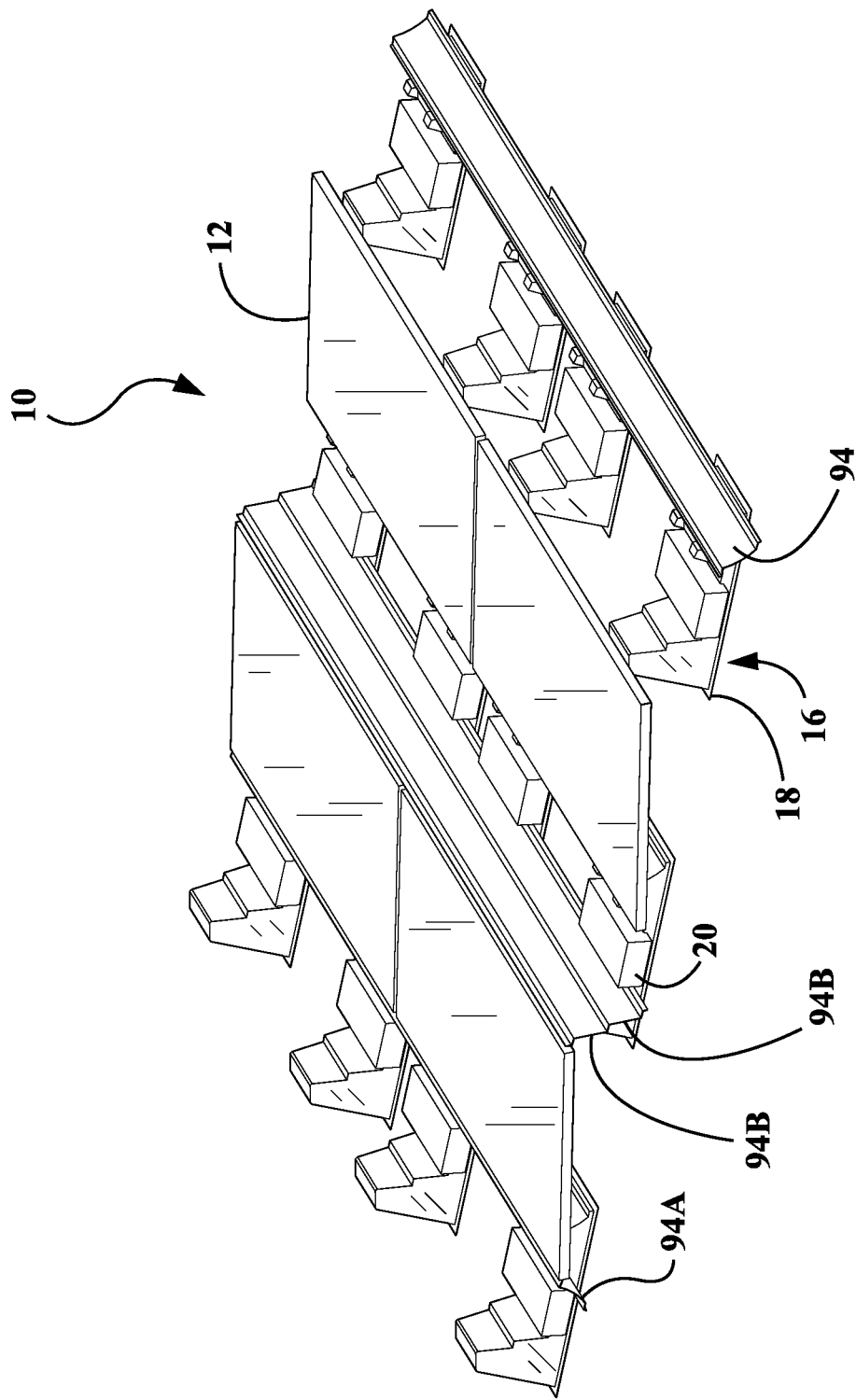
FIG. 9 is a perspective view of an array according to a third embodiment of the present invention.
Figure 10:
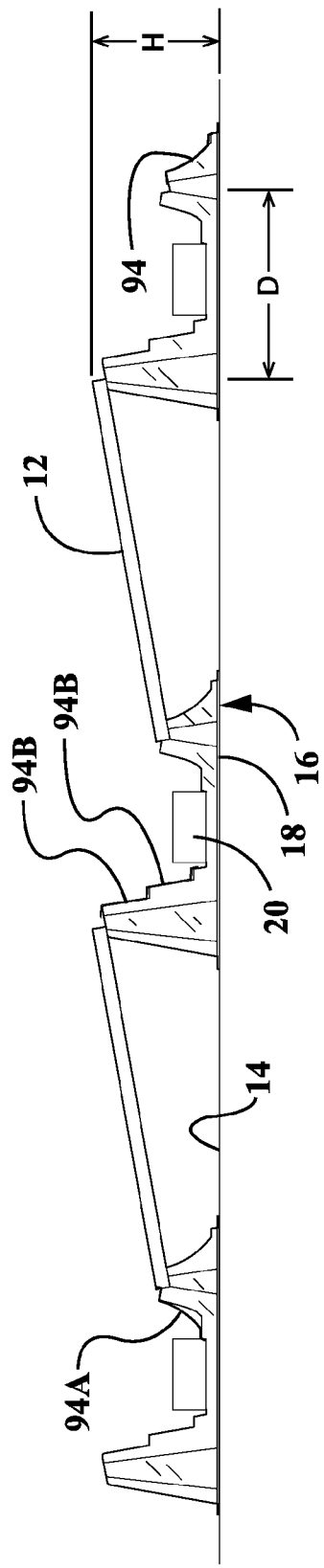
FIG. 10 is a side elevational view of the array of FIG. 9.

FIG. 8 illustrates a PV array 10 according to a second embodiment of the present invention. This embodiment illustrates that the support members 18 can have other suitable forms. The support member 18 of this embodiment includes a hollow plastic reservoir or tank 76 that can be filled with water for ballast weight. It is noted that the support member 18 described hereinabove with regard to the first embodiment of the invention could be modified to accomplish this with very little change. The void or cavity 48 where the concrete ballast blocks rest would be instead filled by the reservoir 76. The illustrated reservoir 76 is formed hollow, filled with water, and sealed closed. A removable cap is provided to seal closed the inlet used to fill the reservoir 76. An air gap within the reservoir 76 allows for water volume changes due to freezing and thawing. The illustrated PV module 12 is supported at four locations by identical feet 78. The attachment system 21 secures the feet 78 to the mounting holes in the PV module's lower flange 24. The attachment system 21 can be any suitable fastener (such as bolt and nuts, plastic push rivets, or the like), clamp, clip, latch, or the like. It is noted that the tank 76 can naturally create a wind barrier to prevent uplift due to wind blowing below the PV modules 12.

Figure 12:
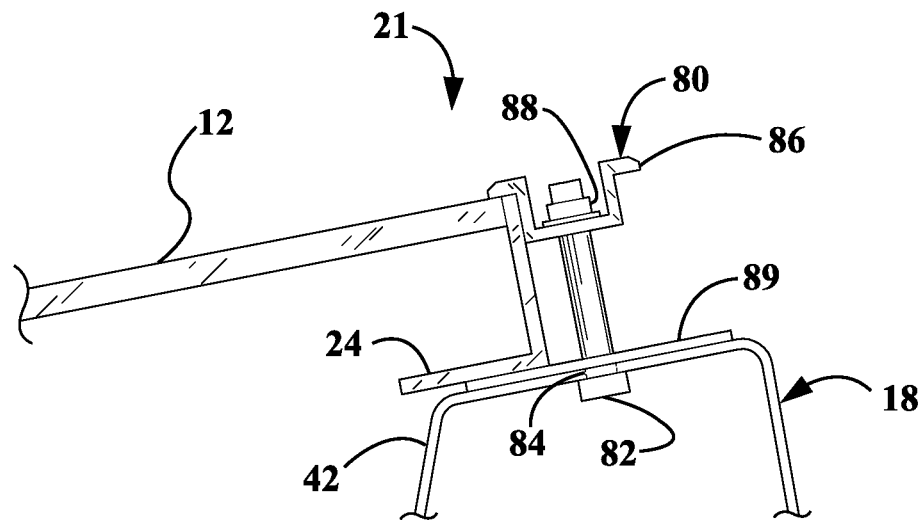
FIG. 12 is a fragmented cross sectional view showing an attachment system for securing the PV modules of the array of FIGS. 9 and 10.
Figure 12A:
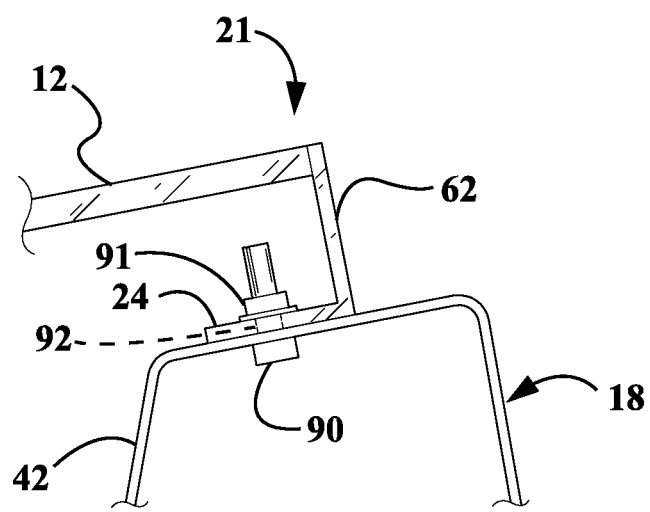
FIG. 12A is a fragmented cross sectional view similar to FIG. 12 but showing an alternative attachment system.

FIGS. 9 to 12 illustrate a PV array 10 according to a third embodiment of the invention. This embodiment also illustrates that the support members 18 can have other suitable forms. The support member 18 of this embodiment is formed so that the ballast 20, which is in the form of a concrete block, can lay flat in a transverse direction centrally on the support member 18. The support member 18 also does not have the abutment forming walls so that the lower flange 24 of the PV modules can rest on the support surfaces 54, 56 and are secured to the support member 18 by the attachment system 21 in the form of a clamp assembly 80. The illustrated clamp assembly 80 (see FIG. 12) includes a threaded stud or bolt 82 that vertically extends through an opening 84 at the support surface 54, 56. A clamping element 86 is secured to the bolt 82 with a nut 88 to form a compression clamp which secures the PV module 12 to the engagement surface 54, 56 of the support member 18 and the clamping element 86. The illustrated clamp assembly 80 includes a metal plate 89 in the form of a disc to secure the stud 82 to the support member 18 but the stud 82 can alternatively be secured in any other suitable manner. The illustrated PV module 12 engages the metal plate 89 and can be conveniently used as a grounding point for the PV Module 12 if desired. Suitable compression clamp assemblies 80 are S-5-PV clamps which are available from Metal Roof Innovations, Ltd, of Colorado Springs, Colo. It is noted that the attachment system 21 can alternatively be any other suitable fastener (such as bolt and nuts, plastic push rivets, or the like), clamp, clip, latch, or the like. FIG. 12A illustrates an alternative attachment system 21 which includes a bolt and nut 90, 91 with the bolt 90 extending through an opening 92 in the lower flange 24 of the PV module 12. This attachment system can be particularly useful when the manufacturer of the PV module 12 requires mounting through the flange openings 92.

This embodiment also includes a rear wind shield or blocker 94 supported by the support members 18 at the rear end of the array system 10 in order to reduce wind load. The illustrated wind shield 94 is held by the rearward most ones of the support members 18 and is shaped and spaced a distance from rearward most ones of the photovoltaic modules 12 to deflect wind, blowing from the north, up and over the array of photovoltaic modules 12 rather than under the photovoltaic modules 12 in order to reduce wind load. The illustrated wind shield 94 extends the full width of the PV array 10 between the outer most lateral edges of the PV modules 12 but any other suitable distance can alternatively be utilized and/or more than one wind shield 94 can be utilized to cover the desired distance. The illustrated wind shield 94 has an arcuate portion forming a concave surface facing rearward and upper and lower flange portions for securing the wind shield 94 to the support members 18. The illustrated upper flange extends in a direction opposed to the convex surface and the illustrated lower flange extends in the direction of the convex surface. The illustrated wind shield 94 is positioned on the rear side of the rearward walls 44 of the rearward most support members 18. The illustrated rearward walls 44 are convex to cooperate with the arcuate portion of the wind shield 94. It is noted that this shape can be effective to deflect a portion of the wind even when the wind shield 94 is not utilized. The illustrated upper flange engages a portion of the second support surface 56 while the illustrated lower flange engages a ledge located at the bottom of the rearward wall 44. The wind shield 94 can be held by the support members 18 in any suitable manner. The illustrated wind shield 94 is positioned a distance D rearwardly from the rearward most ones of the photovoltaic modules 12 which is at least 1.5 times a maximum height H of the rearward most ones of the photovoltaic modules 12 so that wind is deflected up and over the array of photovoltaic modules 12. Constructed in this manner, it is not necessary to close off the entire gap below the rear edge of the rearward most PV modules 12. It is noted that the rear wind shield 94 can be eliminated if desired.

The wind shield 94 is preferably extruded of a lightweight plastic material but it can alternatively be formed in any other suitable manner and/or can alternatively comprise any other suitable material. The lightweight plastic material can be of any suitable type. The wind shield 94 is preferably lightweight and non-structural, that is, it does not significantly increase the structural strength or stiffness of the array system 10.

The illustrated PV array system 10 also includes a front wind shield 94A which is forward facing and positioned at the forward side of the array system 10 to protect against any wind blowing from the south. The front wind shield 94A is located at the front side of the forward most ones of the PV modules 12 and substantially closes the gap under the front edge. The illustrated front wind shield 94A extends the full width of the PV array 10 between the outer most lateral edges of the PV modules 12 but any other suitable distance can alternatively be utilized and/or more than one wind shield 94A can be utilized to cover the desired distance. The front side of the rearward walls 44 of the support members 18 are sized and shaped with ledges and a convex portion to cooperate with the front wind shield 94A in a manner similar to the way the rear side of the rearward walls 44 cooperate with the rear wind shield 94. The front wind shield 94A is preferably constructed identical to the rear wind shield 94 so that the advantages of common parts can be utilized. It is noted that the front wind shield 94A can be eliminated if desired.

The illustrated PV array system 10 further includes intermediate wind shields 94B which are rearward facing and positioned between the forward and rearward sides of the array system 10 to protect against any wind blowing from the north at a steep angle or the like. While these wind shields 94B may not be effective to deflect all wind up and over the PV modules 12, they can still reduce the amount of wind that passes under the PV modules 12. The intermediate wind shields 94B are located at intermediate ones of the support members 18. The illustrated intermediate wind shields 94B extend the full width of the PV array 10 between the outer most lateral edges of the PV modules 12 but any other suitable distance can alternatively be utilized and/or more than one wind shield 94B can be utilized to cover the desired distance. The illustrated rear sides of forward walls 42 of the support members 18 are sized and shaped with ledges and to cooperate with a pair of the intermediate wind shields 94B one above the other in a manner similar to the way the rearward walls 44 cooperate with the rear wind shield 94. Configured in this manner the intermediate wind shields 94B substantially close the entire gap below the rearward side of PV modules 12 located between the forward and rearward sides of the PV array system 10. The intermediate wind shields 94B are preferably constructed identical to the rear wind shield 94 so that the advantages of common parts can be utilized. It is noted that the intermediate wind shields 94B can be eliminated if desired.

Figure 13:
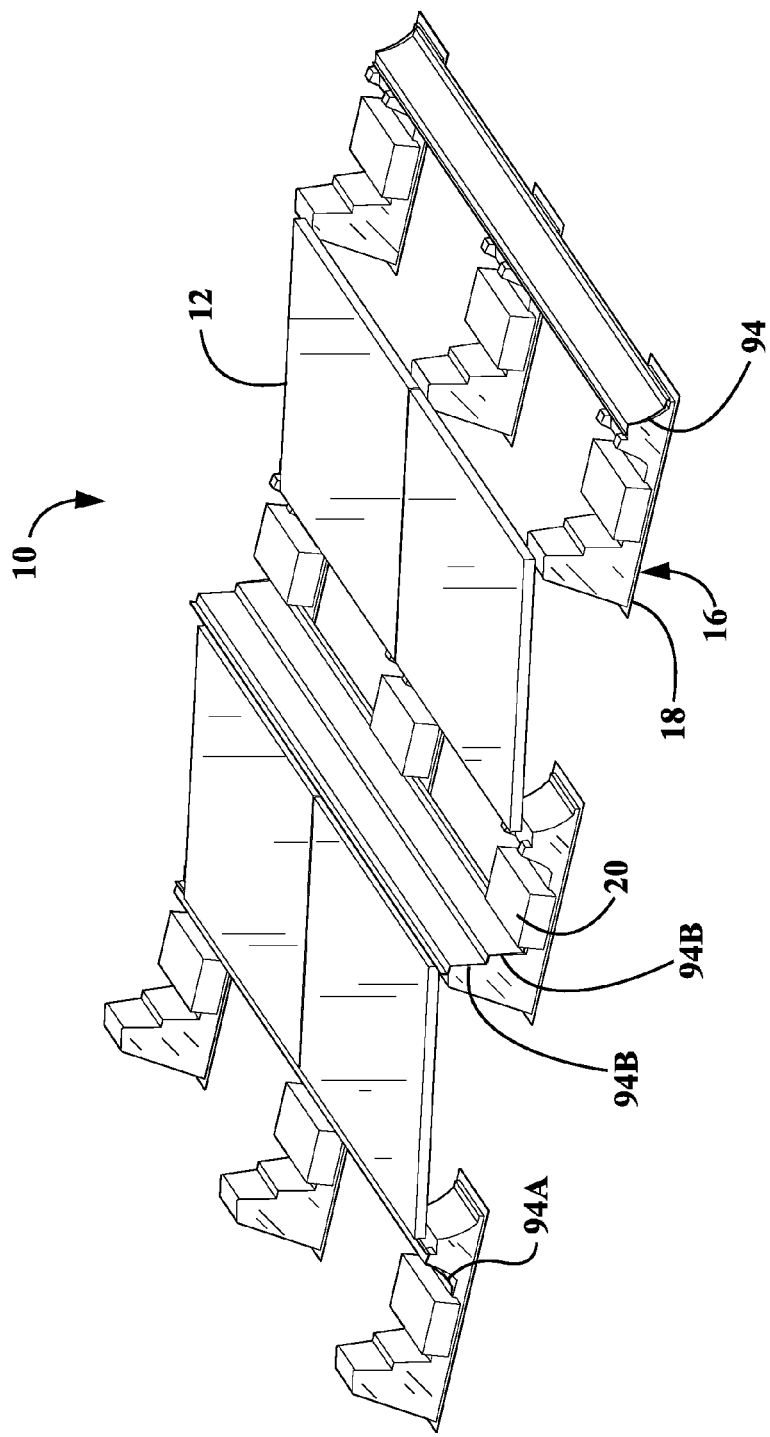
FIG. 13 is another perspective view of an alternative version of the array of PV modules shown in FIGS. 9 to 11 but wherein the PV modules are secured in a different orientation.

As best shown in FIG. 13, the PV modules 12 can be mounted using the same support members 18 described-above to mount the PV modules 12 in the portrait orientation rather than the landscape orientation.

Figure 14:
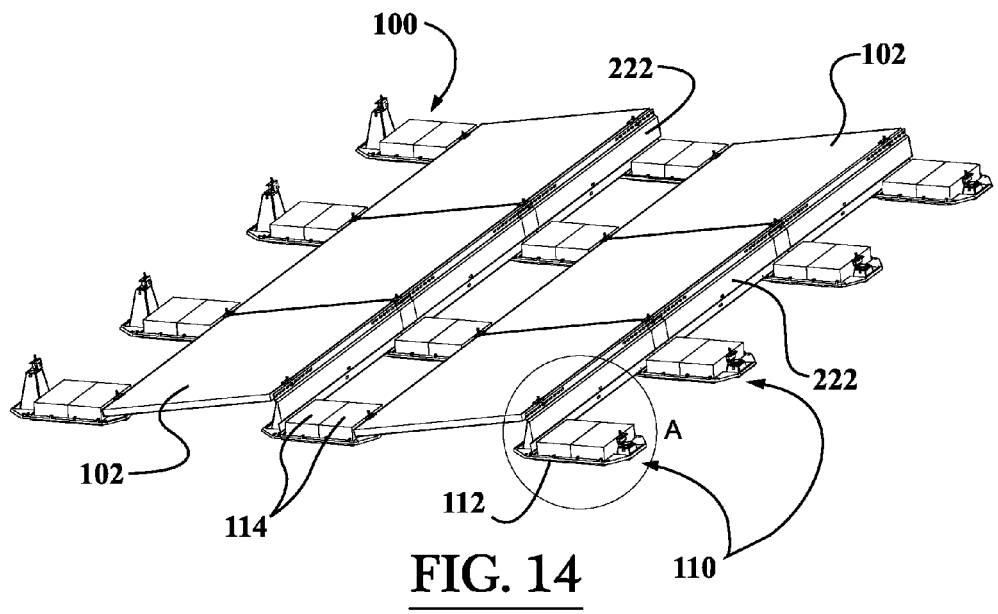
FIG. 14 is a perspective view of an array according to a fourth embodiment of the present invention.
Figure 15:
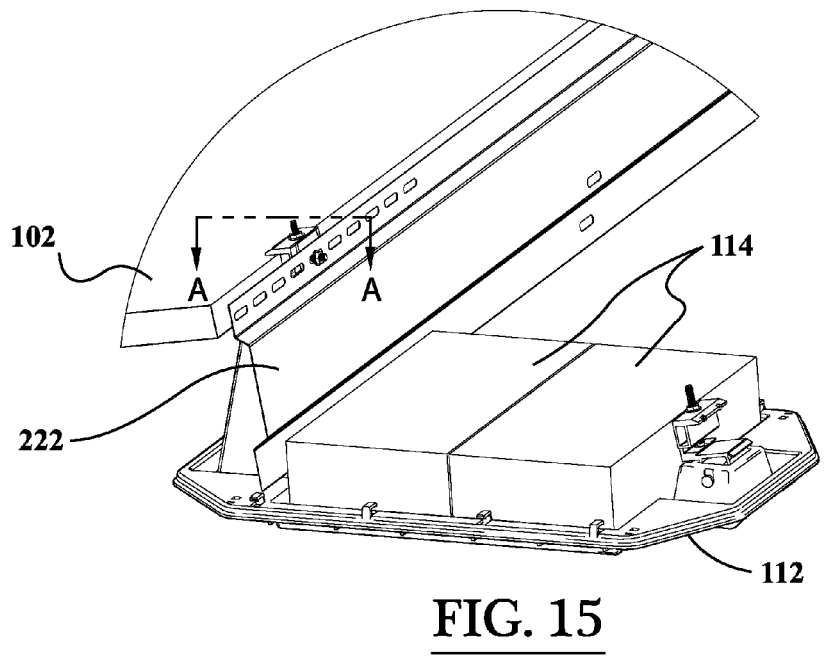
FIG. 15 is an enlarged perspective view of an encircled portion of FIG. 14 (Detail A), showing a support assembly of the mounting system.
Figure 16:
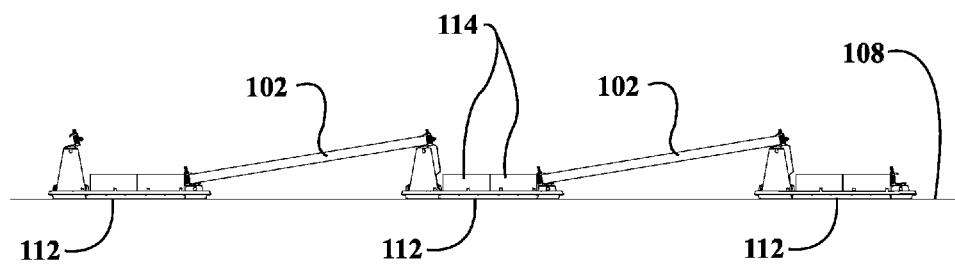
FIG. 16 is a side elevational view of the array of FIG. 14.

FIGS. 14-16 illustrate a photovoltaic system or array 100 according to a fourth embodiment of the present invention. As described above for the preceding embodiments, the illustrated photovoltaic system or array 100 includes an array of solar panels or PV modules 102 mounted to a substantially flat support surface 108 (see FIG. 16) in the form of a building rooftop 108 by a mounting system or assembly 110. In FIG. 14, there are two rows of PV modules 102 illustrated for exemplary purposes, each of the two rows having three (3) PV modules 102 disposed therein. The illustrated mounting system 110 includes a plurality of support assemblies 112 (or support assembly members 112) that rest on the support surface 108 and support and orient the PV modules 102 above the support surface 108 and a plurality of ballasts 114 in the form of ballast blocks that weight the support assemblies 112 to the support surface 108 to maintain the position of the support assemblies 112 on the support surface 108. As shown in FIG. 14, the four (4) support assemblies 112 disposed in the middle of the PV array 100 bridge the two rows of PV modules 102. The PV array 100 illustrated in FIGS. 14-16 has each of the rectangular shaped PV modules 102 oriented in a landscape orientation, that is, with the longest axis of the PV modules 102 extending in a lateral or side-to-side direction which is typically the east-west direction. It is noted, however, that the PV modules 102 can alternatively be oriented by the support assemblies 112 in a portrait orientation, that is, with the longest axis of the PV modules 102 extending in a forward-rearward direction which is typically the south-north direction (see FIG. 24). In either the landscape or portrait orientations, the illustrated PV modules 102 are supported in an inclined position such that the forward end of each PV module 102 is positioned lower than its rearward end so that typically the southern end is positioned lower than the northern end.

Figure 24:
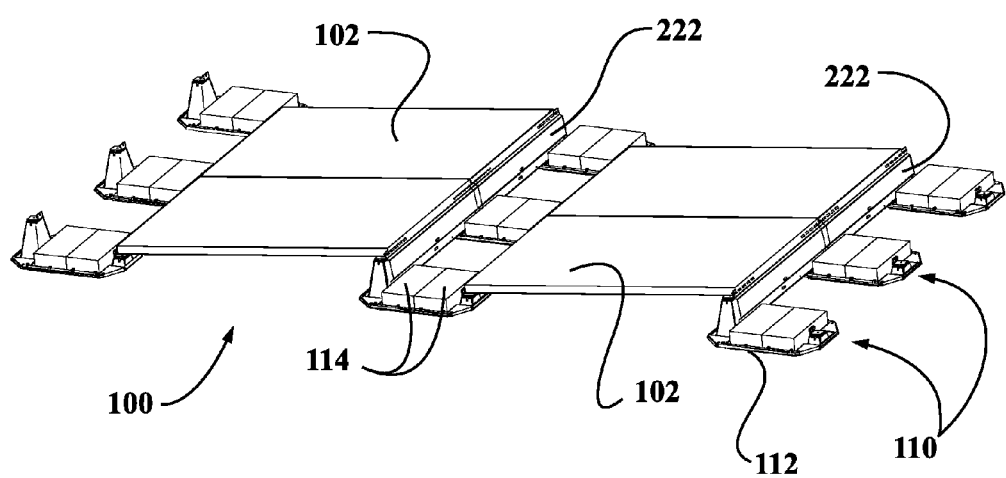
FIG. 24 is another perspective view of an alternative version of the array of PV modules shown in FIG. 14 but wherein the PV modules are secured in a different orientation.

As shown in the perspective views of FIGS. 14 and 24, each illustrated PV module 102 is supported by a plurality of the support assemblies 112 (performing a function similar to the support members 18 described above). At least three of the support assemblies 112 must be utilized for each of the PV modules 102 in order to establish a desired plane for the PV modules 102. For the illustrated rectangular-shaped PV modules 102, at least four of the support assemblies 112 are preferably utilized to support each of the PV modules 102 so that they can be positioned at or near each corner of the rectangular-shaped PV modules 102. Each support assembly 112 supports at least one of the PV modules 102 but some of the illustrated support assemblies 112 support more than one of the PV modules 102. The illustrated PV modules 102 are secured to the support assemblies 112 (as described in more detail hereinafter) but each of the support assemblies 112 is not directly secured to any of the other support assemblies 112 (e.g., there is no rail member connecting one support assembly to another support assembly). As described above for the support members 18, it is noted that while there is not a direct structural connection between the support assemblies 112, the support assemblies 112 are indirectly connected by the PV modules 102 in a structural manner (i.e., they are connected in a load carrying manner). Also, similar to that described above for the preceding embodiments, it is further noted that non-load bearing components, such as wind shields (or wind deflectors), wire trays, and the like can also be supported by the support assemblies 112 as described in more detail hereinafter. Thus, the support assemblies 112 are only structurally connected to one another through the PV modules 102. Securing the support assemblies 112 at or near the corners of PV modules 102, and not directly connecting them to one another, allows the mounting system 110 to be used with PV modules 102 of any width and length without requiring customization or modification to the support assemblies 112 or the PV modules 102. Thus, a common support assembly 112 can be used in many applications to mount many different models of PV modules 102. Also, the illustrated support assemblies 112 are not fastened to the support surface 108 and simply rest on the support surface 108 as they are weighted in place by the ballasts 114. Therefore, the support assemblies 112 do not penetrate the roof membrane of the support surface 108, nor do they require fasteners that penetrate the roof membrane of the support surface 108. That is, the support assembly 112 is in the form of a non-penetrating support device that does not penetrate the support surface 108.

Similar to that described above for the support member 18, with the exception of the clamping assembly components, the support assembly 112 can be formed entirely of polymer or plastic. That is, the body portion of the support assembly 112 (see FIGS. 18-22), which includes the base portion 116, the first upright support member 120, and the second upright support member 134 can be formed entirely of polymer or plastic, and components 116, 120, 134 can all be molded as an integral unit from a polymer or plastic. One suitable polymer or plastic for the body of the support assembly 112 is acrylonitrile styrene acrylate (ASA) Luran® by Styrolution. The use of a highly durable plastic, such as Luran®, ensures that the support assembly 112 will be able to withstand the toughest rooftop exposure for twenty-five (25) years or more (i.e., the support assembly 112 has substantial weatherability). Advantageously, plastic is harmless on the roof membrane, it is non-corrosive, it is non-conductive (i.e., it does not pose any electrical potential threat), and it has a low cost.

Now, with particular reference to FIGS. 17-22, the structural features of the illustrated support assembly 112 will be described in detail. As best shown in the perspective views of FIGS. 17 and 18, the support assembly 112 generally comprises a base portion 116, the base portion 116 including a recessed portion 118 for accommodating one or more ballasts 114; a first upright support member 120 coupled to the base portion 116, the first upright support member 120 having a top surface 128, the top surface 128 being disposed at a first elevation E1 relative to the base portion 116 of the support assembly 112 (i.e., relative to the bottom surface of the base portion 116—see FIG. 22); and a second upright support member 134 coupled to the base portion 116, the second upright support member 134 spaced apart from the first upright support member 120 across the recessed portion 118 of the base portion 116, the second upright support member 134 having a top surface 142, the top surface 142 being disposed at a second elevation E2 relative to the base portion 116 of the support assembly 112 (i.e., relative to the bottom surface of the base portion 116—see FIG. 22). As shown in the side view of FIG. 22, the first elevation E1 of the top surface 128 is higher than the second elevation E2 of the top surface 142. Also, as illustrated in FIGS. 17 and 18, each of the first and second upright support members 120, 134 is provided with a respective peripheral recess 132, 146 therearound.

Figure 17:
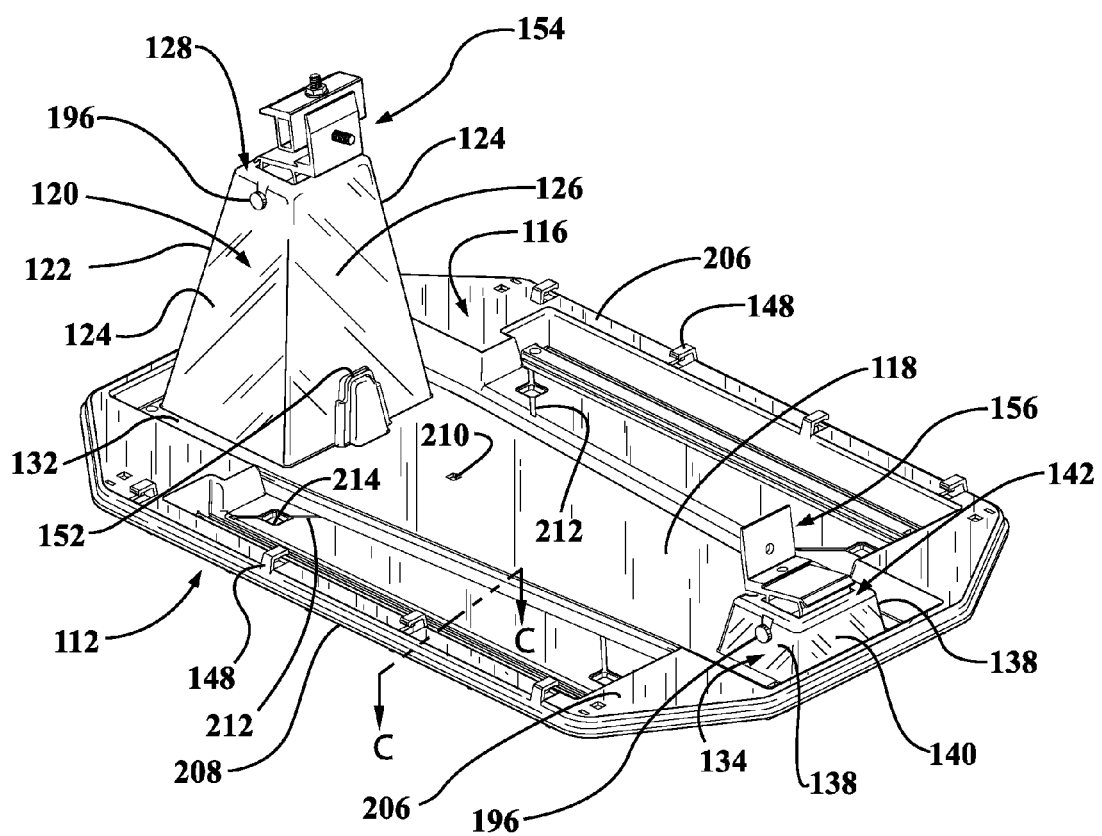
FIG. 17 is a top/rear perspective view of one of the support assemblies of FIGS. 14-16.
Figure 18:
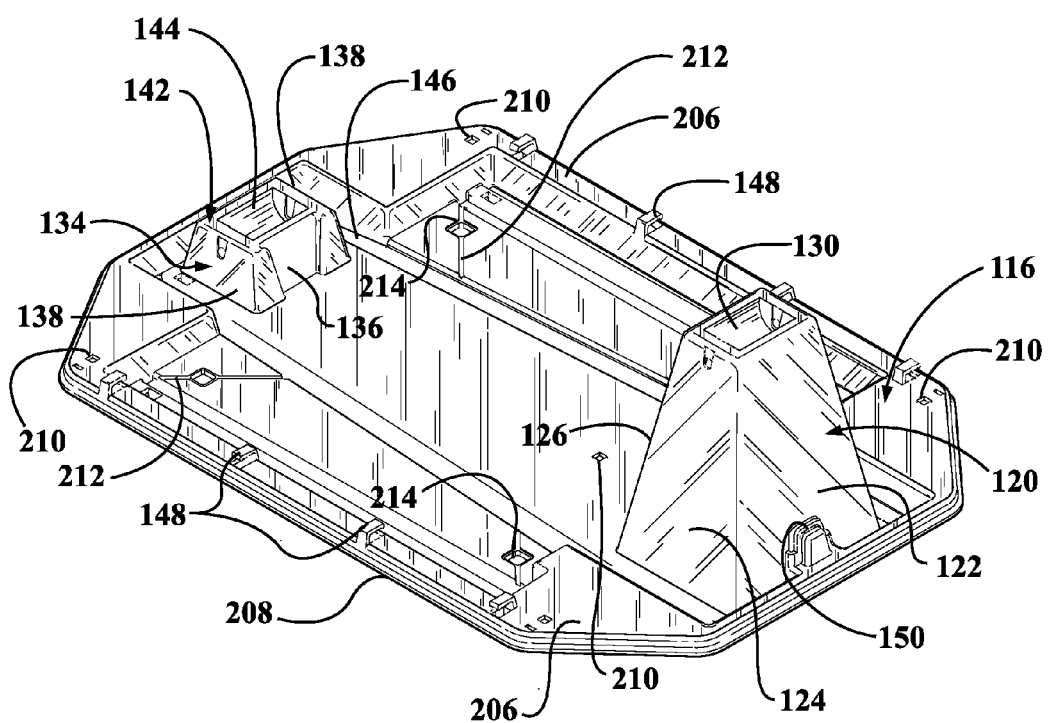
FIG. 18 is a top/front perspective view of the support assembly of FIG. 17, wherein the rotatable clamp subassemblies have been removed from the first and second upright support members so that certain features of the body portion of the support assembly can be more clearly illustrated.

As shown in the top perspective views of FIGS. 17 and 18, the base portion 116 of the support assembly 112 is provided with a peripheral ledge 206 around the periphery thereof. The peripheral ledge 206 of the base portion 116 circumscribes the recessed portion 118 of the support assembly, as well as the first and second upright support members 120, 134. At the outermost edge of the peripheral ledge 206, the base portion 116 is provided with a downturned peripheral edge 208 that circumscribes the entire support assembly 112 (see e.g., FIGS. 17 and 32). Now, turning to the bottom perspective view of FIG. 19, it can be seen that each opposed side portion of the peripheral ledge 206 is provided with a plurality of longitudinally spaced apart reinforcement ribs 220 disposed thereunder. The reinforcement ribs 220 structurally support the opposed side portions of the peripheral ledge 206, and more generally, add structural rigidity to the support assembly as a whole.

Similar to that described above for the support members 18, the recessed portions 118 of the base portions 116 of the support assemblies 112 are designed to accommodate a plurality of ballasts 114 (e.g., two (2) ballasts 114 arranged side-by-side as illustrated in FIGS. 14 and 15). In an exemplary embodiment, the ballast blocks 114 are of the size 4"×8"×16" and weigh about 31.5 pounds each based on ASTM Designation C1491-01a.

As described above for the preceding embodiments, the generally hollow shape and large draft angles of the plastic body portion of the support assemblies 112 (i.e., the plastic body portion comprising the base portion 116, the first upright support member 120, and the second upright support member 134) allow for the illustrated support assemblies 112 to be nested together when stacked to lower shipping and handling costs.

With continued reference to FIGS. 17-22, it can be seen that the first upright support member 120 comprises a front wall 122, opposed side walls 124, and a rear wall 126. Each of these walls 122, 124, 126 is sloped inwardly in an upward direction such that the first upright support member 120 has a generally truncated pyramidal shape. Similarly, the second upright support member 134 comprises a front wall 136, opposed side walls 138, and a rear wall 140. Like the walls 122, 124, 126 of the first upright support member 120, the walls 136, 138, 140 of the second upright support member 134 are also sloped inwardly in an upward direction so as to also give the second upright support member 134 a generally truncated pyramidal shape. However, as shown most clearly in FIGS. 17 and 18, the pyramidal second upright support member 134 has a much smaller footprint and height than the pyramidal first upright support member 120. While the illustrated first and second upright support members 120, 134 generally have truncated pyramidal shapes, it is to be understood that other suitable shapes may be used for the first and second upright support members 120, 134 such as, for example, a rectangular shape (i.e., alternative upright support members could have a post-like appearance).

As best illustrated in FIG. 18, the first and second upright support members 120, 134 are provided with respective concave notches or pockets 130, 144 for receiving respective base portions of respective rotatable clamp subassemblies 154, 156. Referring to the assembled view of FIG. 17, it can be seen that the illustrated support assembly 112 comprises a first rotatable clamp subassembly 154 rotatably coupled to the first upright support member 120 via a clevis pin 196, which is received within a clevis pin aperture 129 (see FIG. 22). The first rotatable clamp subassembly 154 is configured to be coupled to one or more photovoltaic modules 102 (e.g., to the north side of one or more photovoltaic modules 102, as illustrated in FIG. 14). Similarly, the second rotatable clamp subassembly 156 is rotatably coupled to the second upright support member 134 via a clevis pin 196, which is received within a clevis pin aperture 143 (see FIG. 22). The second rotatable clamp subassembly 156 is configured to be coupled to one or more other photovoltaic modules 102 (e.g., to the south side of one or more photovoltaic modules 102, as illustrated in FIG. 14). In one embodiment, the clevis pins 196 are in the form of self-locking implanted cotter pin (SLIC) type clevis pins that snap into place without the need for a cotter pin or other secondary retention part. Advantageously, by eliminating the use of a cotter pin, the SLIC clevis pin (or SLIC pin) saves installation time and money. Although, it is to be understood that other suitable fasteners may also be used to attach the first and second rotatable clamp subassemblies 154, 156 to their respective first and second upright support members 120 and 134. It is to be understood that different ones of the first, second, and third clamp subassemblies described hereinafter can be used together in the same support assembly 112 to accommodate various PV module mounting configurations (e.g., first clamp subassembly in notch 130 and second clamp subassembly in notch 144).

Figure 25:
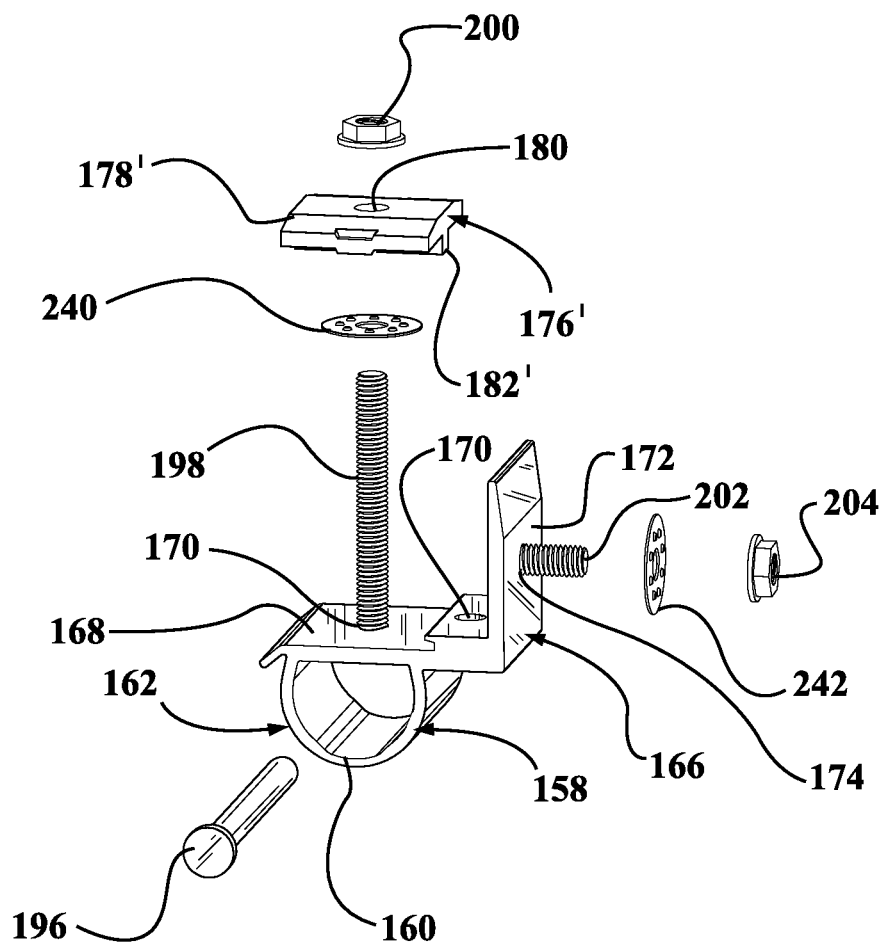
FIG. 25 is an exploded perspective view of a first type of clamp subassembly of the support assembly.

A first type of clamp subassembly (or clamp assembly) used as PV module attachment means of the support assembly 112 is illustrated in FIG. 25. As shown in the exploded view of FIG. 25, the first type of clamp subassembly generally comprises a pivotal base member 158 and an upper clamp member 176', wherein the upper clamp member 176' is coupled to the pivotal base member 158 by a fastener (e.g., headless-type assembly bolt 198 with corresponding nut 200). Referring again to FIG. 25, it can be seen that the pivotal base member 158 further includes a base portion 160 with a curved bottom surface 162, and an L-shaped flange portion 166 with a flange base portion 168 and an upright portion 172. The flange base portion 168 of the L-shaped flange portion 166 comprises fastener apertures 170 for accommodating a fastener (e.g., headless-type assembly bolt 198). In the illustrated embodiment, the fastener apertures 170 are provided with a plurality of internal threads for matingly engaging with the external threads on the bolt 198. In another embodiment, the end of the bolt 198 can be embedded in the flange base portion 168. A lock washer 240, which has a plurality of small projections or protrusions disposed thereon (e.g., semispherical projections), may be provided between the installed PV modules 102 and the flange base portion 168. The upright portion 172 of the L-shaped flange portion 166 also comprises a fastener aperture 174 for accommodating a fastener (e.g., headless-type bolt 202 with corresponding nut 204, which can be used for securing the top edge portion of the wind deflector 222 to the support assembly 112—see FIGS. 15 and 23). Similar to the fastener aperture 170, the fastener aperture 174 of the illustrated embodiment is provided with a plurality of internal threads for matingly engaging with the external threads on the bolt 202. In another embodiment, the end of the bolt 202 can be embedded in the upright portion 172. A lock washer 242, which has a plurality of small projections or protrusions disposed thereon (e.g., semi-spherical projections), may be provided between the nut 204 and the upright portion 172, or the installed wind deflector 222 and the upright portion 172.

Still referring to FIG. 25, it can be seen that the upper clamp member 176' generally comprises a plate portion 178' with a fastener aperture 180 disposed therethrough for accommodating a fastener (e.g., headless-type assembly bolt 198 with corresponding nut 200). In the approximate middle of the plate portion 178' of the upper clamp member 176', extending from the bottom surface thereof, a longitudinally extending protrusion 182' is provided. The protrusion 182' is configured to extend into the gap between adjacent PV modules 102 when the plate portion 178' is tightened against the top surface of the PV modules 102 (e.g., by torqueing nut 200).

Figure 26:
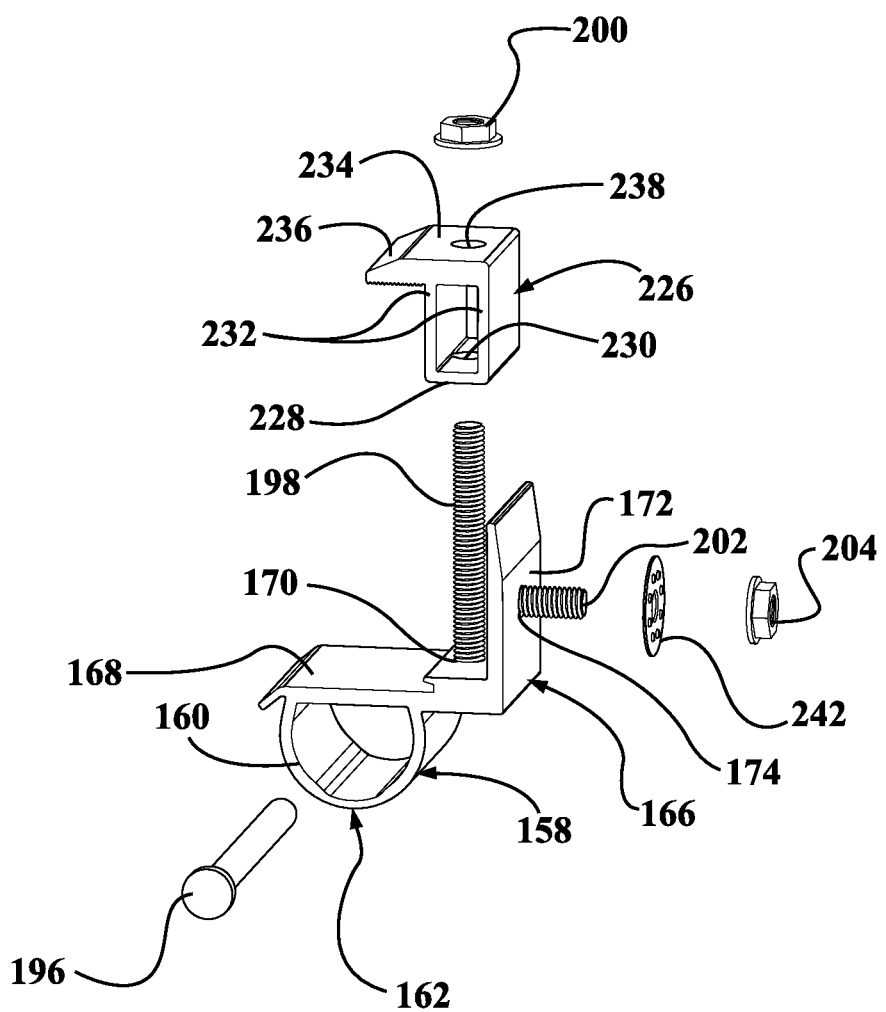
FIG. 26 is an exploded perspective view of a second type of clamp subassembly of the support assembly.
Figure 27:
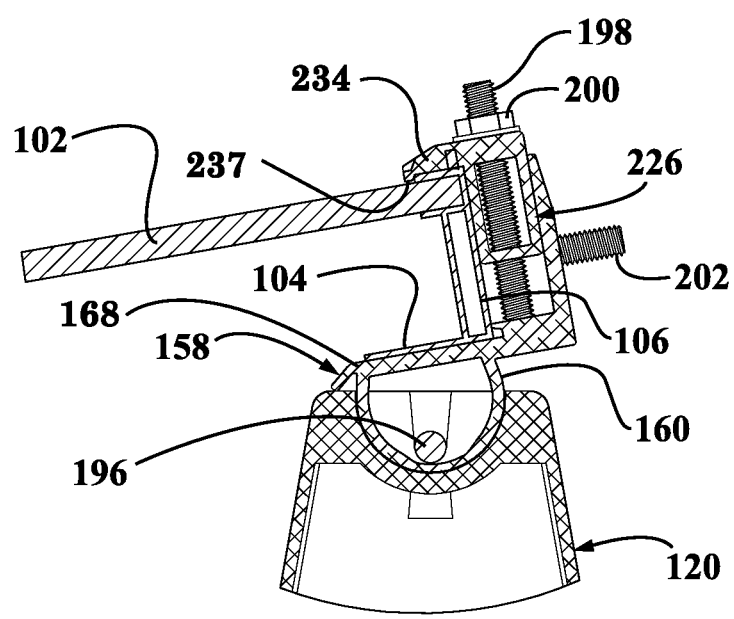
FIG. 27 is a partial sectional view illustrating the second type of clamp subassembly of the support assembly attached to a PV module, wherein the section is cut along the cutting-plane line A-A in FIG. 15.

A second type of clamp subassembly (or clamp assembly) used as PV module attachment means of the support assembly 112 is illustrated in FIGS. 26 and 27. As shown in the exploded view of FIG. 26, the second type of clamp subassembly generally comprises a pivotal base member 158 and an L-shaped side clamp member 226, wherein the L-shaped side clamp member 226 is coupled to the pivotal base member 158 by a fastener (e.g., headless-type assembly bolt 198 with corresponding nut 200). Referring again to FIG. 26, it can be seen that the structure of the pivotal base member 158 of the second type of clamp subassembly is generally the same as that described above for the first type of clamp subassembly. Although, unlike in the first clamp subassembly, the headless-type assembly bolt 198 in FIG. 26 is disposed in the fastener aperture 170 disposed closest to the upright portion 172 of the L-shaped flange portion 166 of the pivotal base member 158. The components of the second clamp subassembly for attaching the top edge portion of the wind deflector 222 thereto are also generally the same as that described above for the first type of clamp subassembly. As such, no further elaboration on these components is required in conjunction with the second type of clamp subassembly.

With continued reference to FIG. 26, it can be seen that the L-shaped side clamp member 226 generally comprises a bottom wall 228, opposed side walls 232 connected to the bottom wall 228, and an upper plate portion 234 connected to the upper ends of the opposed side walls 232. The bottom wall 228 of the L-shaped side clamp member 226 comprises a fastener aperture 230 disposed therethrough for accommodating a fastener (e.g., headless-type assembly bolt 198 with corresponding nut 200). The upper plate portion 234 of the L-shaped side clamp member 226 comprises a fastener aperture 238 disposed therethrough, which is generally axially aligned with the fastener aperture 230, for accommodating a fastener (e.g., headless-type assembly bolt 198 with corresponding nut 200). As shown in FIG. 26, the upper plate portion 234 of the L-shaped side clamp member 226 also includes a chamfered edge 236.

Next, referring primarily to the sectional view of FIG. 27, the manner in which the second clamp subassembly engages one or more PV modules 102 will be described. In this figure, it can be seen that, when the L-shaped side clamp member 226 is tightened against the upper surface of the PV module 102 (e.g., by torqueing nut 200), the bottom flange 104 of the PV module 102 abuts the upper surface of base portion 160 of the pivotal base member 158, and the side flange 106 of the PV module 102 abuts the inner side wall 232 of the L-shaped side clamp member 226. As such, the one or more PV modules 102 are clamped into place on the support assembly 112.

Advantageously, the clamp subassembly illustrated in FIGS. 26 and 27 is capable of being used as a universal-type clamp that can be attached anywhere along a side of a PV module 102. As such, when the clamp subassembly of FIGS. 26 and 27 is used, there is no need for two different types of clamps in the PV module installation (i.e., a separate mid-clamp and end clamp are not required when the clamp subassembly of FIGS. 26 and 27 is used). Thus, the use of the universal clamp subassembly of FIGS. 26 and 27 advantageously reduces the part count of the PV module mounting system, as compared to installations requiring separate mid-clamps and end clamps. As best shown in the sectional view of FIG. 27, the cantilevered portion of the upper plate portion 234 of the L-shaped clamp member 226 comprises one or more protrusions 237 that are designed to penetrate the non-conductive, anodized layers of the PV module 102 so as to provide a ground current path (or a current path to ground) when the clamp member 226 is compressed against the PV module 102 by the tightening of the nut 200. In one or more embodiments, the clamp member 226 may comprise a plurality of spaced-apart protrusions 237 along an extending length of the cantilevered portion of the upper plate portion 234. Also, in one or more embodiments, a top surface of the flange base portion 168 of the pivotal base member 158 may be provided with a spacer member (e.g., a piece of foam or other suitable spacer member) disposed approximately in the middle of the top surface of the flange base portion 168. Similar to the spacer members with abutments 58, 60 and 64, 66 described above with regard to the embodiment illustrated in FIGS. 3-6, the spacer member on the top surface of the flange base portion 168 facilitates the proper east-west positioning of adjacent PV modules 102 in a row when the clamp assembly of FIGS. 26 and 27 is used as a mid-clamp connecting two adjacent PV modules 102.

Figure 28:
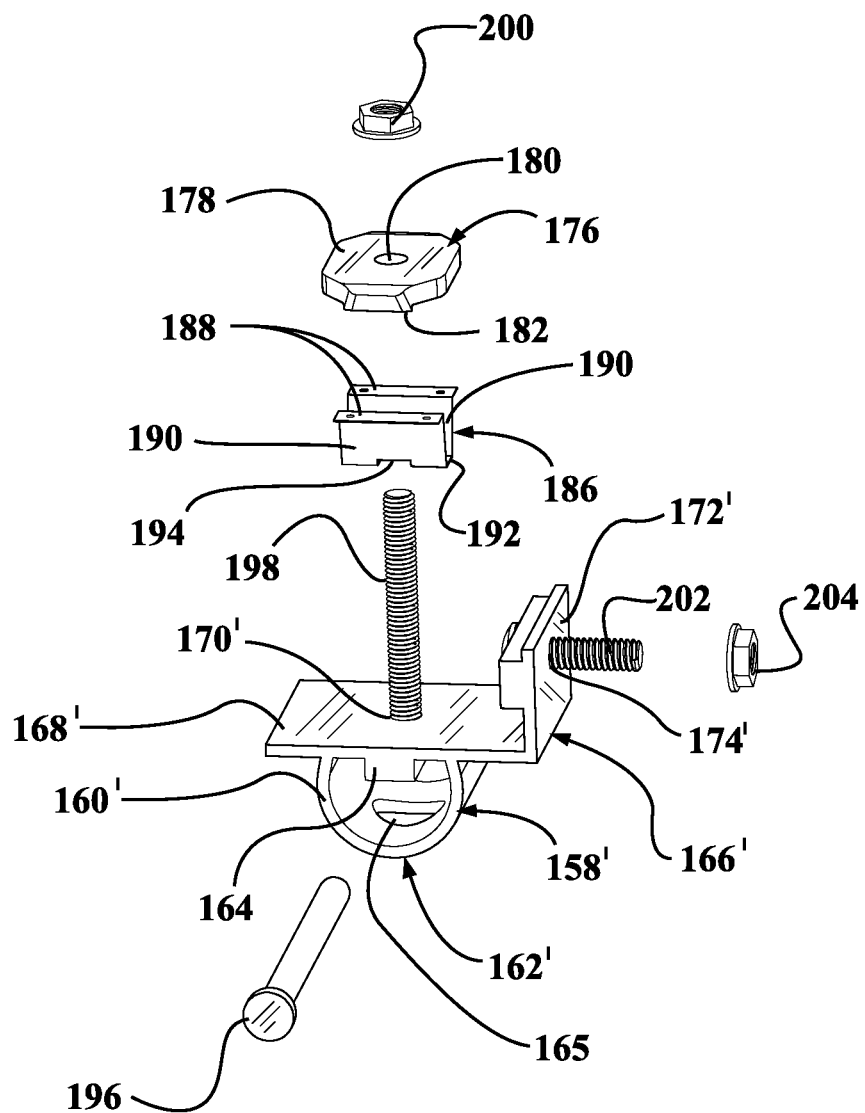
FIG. 28 is an exploded perspective view of a third type of clamp subassembly of the support assembly.
Figure 29:
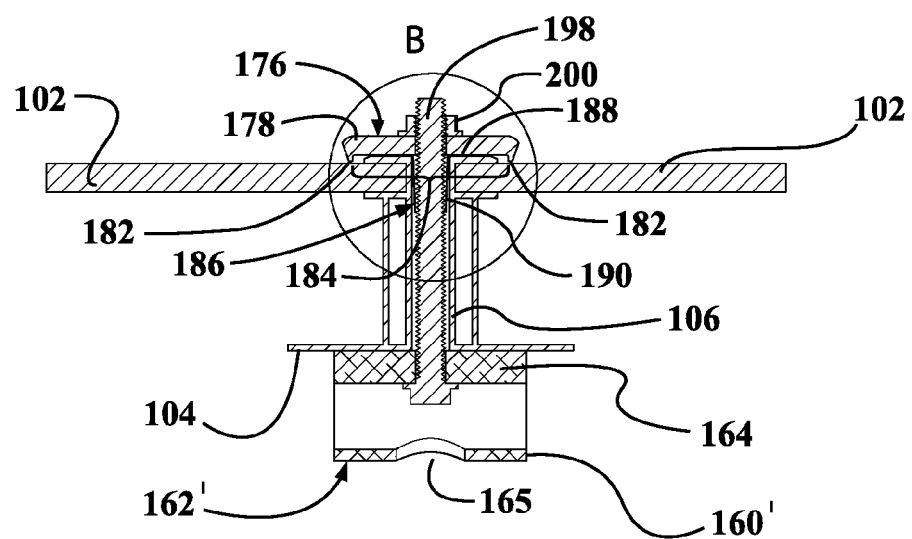
FIG. 29 is a partial sectional view of the third type of clamp subassembly of the support assembly, wherein the section is cut along the cutting-plane line B-B in FIG. 30.
Figure 30:
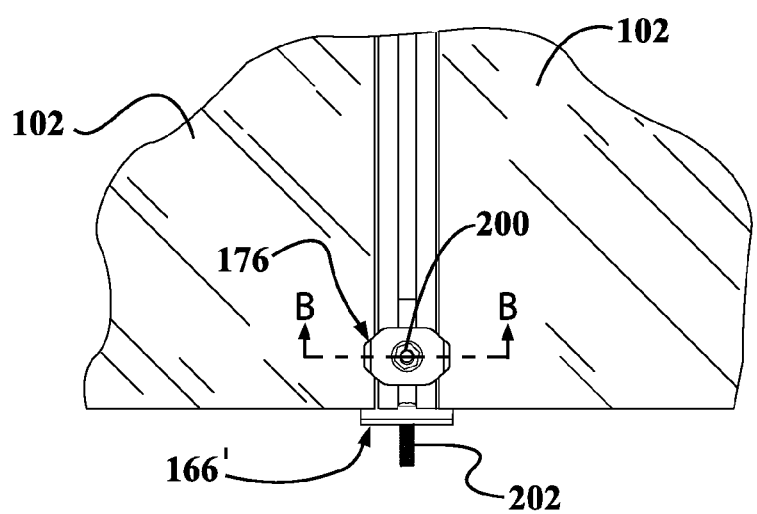
FIG. 30 is a partial top plan view of adjacent PV modules supported using the third type of clamp subassembly of the support assembly.

A third type of clamp subassembly (or clamp assembly) used as PV module attachment means of the support assembly 112 is illustrated in FIGS. 28-30. Initially, as shown in the exploded view of FIG. 28, the third type of clamp subassembly generally comprises a pivotal base member 158', an upper clamp member 176 coupled to the pivotal base member 158' by a fastener (e.g., headless-type assembly bolt 198 with corresponding nut 200), and a bonding clamp member 186 coupled to the upper clamp member 176 and the pivotal base member 158' by the fastener (e.g., 198, 200), wherein a portion of the bonding clamp member 186 is configured to be disposed between two PV modules 102 (refer to the sectional views of FIGS. 29 and 33). Referring again to FIG. 28, it can be seen that the pivotal base member 158' further includes a base portion 160' with a curved bottom surface 162', and an L-shaped flange portion 166' with a flange base portion 168' and an upright portion 172'. The base portion 160' of the pivotal base member 158' comprises a generally downwardly extending protrusion 164 transversely disposed thereacross, and an aperture 165 disposed through the curved bottom surface 162' thereof. The flange base portion 168' of the L-shaped flange portion 166' comprises a fastener aperture 170' for accommodating a fastener (e.g., headless-type assembly bolt 198). In the illustrated embodiment, the fastener aperture 170' is provided with a plurality of internal threads for matingly engaging with the external threads on the bolt 198. In another embodiment, the end of the bolt 198 can be embedded in the flange base portion 168'. The upright portion 172' of the L-shaped flange portion 166' also comprises a fastener aperture 174' for accommodating a fastener (e.g., headless-type bolt 202 with corresponding nut 204, which can be used for securing the top edge portion of the wind deflector 222 to the support assembly 112). Similar to the fastener aperture 170', the fastener aperture 174' of the illustrated embodiment is provided with a plurality of internal threads for matingly engaging with the external threads on the bolt 202. In another embodiment, the end of the bolt 202 can be embedded in the upright portion 172'.

Figure 33:
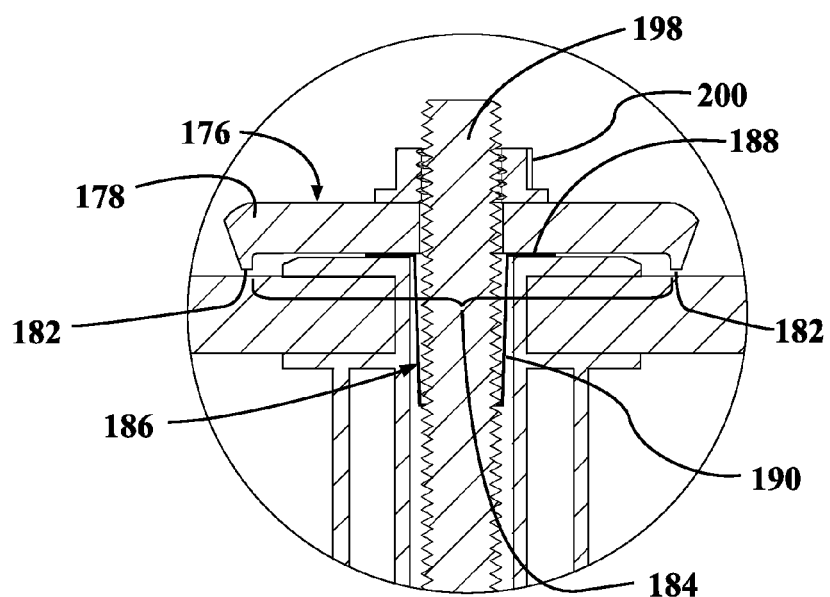
FIG. 33 is an enlarged partial sectional view of an encircled portion of FIG. 29 (Detail B), showing a bonding clamp member of the clamp subassembly of FIG. 29 in more detail.

Still referring to FIG. 28, it can be seen that the upper clamp member 176 generally comprises a plate portion 178 with a fastener aperture 180 disposed therethrough for accommodating a fastener (e.g., headless-type assembly bolt 198 with corresponding nut 200). The upper clamp member 176 further comprises spaced apart protrusions 182 (see FIG. 29) extending from a lower surface thereof, wherein a gap 184 is formed between the spaced apart protrusions 182 of the upper clamp member 176, and wherein the spaced apart protrusions 182 are configured to prevent the one or more PV modules 102 from becoming disengaged from the upper clamp member 176, and the gap 184 between the spaced apart protrusions 182 is configured to accommodate thermal expansion and contraction of the one or more photovoltaic modules 102. As shown in FIGS. 29 and 33, the spaced apart protrusions 182 are disposed on opposite sides of PV module flanges when the upper clamp member 176 is tightened against the top surface of the PV modules 102 (e.g., by torqueing nut 200). Thus, the upper clamp member 176 is in the form of a compression clamp (i.e., it is compressed against the top surfaces of the PV modules 102 by the tightening of the nut 200). In some embodiments, the flange base portions 168, 168' may include spaced apart protrusions, similar to the spaced apart protrusions 182 of the upper clamp member 176.

In one or more embodiments, the upper clamp member 176 and the bonding clamp member 186 of the third clamp subassembly each comprises a conductive material so as to provide integrated grounding for the one or more PV modules 102. For example, the upper clamp member 176 and the bonding clamp member 186 may individually, together, or in cooperation with other components of the support assembly 112, form a grounding current path between adjacent PV modules 102. In particular, the upper clamp member 176 may be formed of stainless steel for strength and to be conductive with the bonding clamp member 186. As explained above, the spaced apart protrusions 182 disposed on the lower/outer edges prevent the PV modules 102 from sliding out and becoming unattached from the upper clamp member 176 of the support assembly 112. The gap 184 between the spaced apart protrusions 182 allows for thermal movements. While the illustrated bonding clamp member 186 comprises one form of a bonding method that may be practiced in accordance with the principles of the invention, it is to be understood that other components of the support assembly 112 may provide integrated grounding for the PV modules 102 as well, such as other components of the clamp subassemblies (e.g., in some embodiments, all components of the clamp subassemblies may be conductive for grounding purposes). Advantageously, the support assembly 112 described herein comprises one or more components, such as the pivotal base member 158, 158', the upper clamp members 176, 176', the bonding clamp member 186, and the L-shaped side clamp member 226, that integrates grounding from one PV module 102 to the next. The upper clamp member 176 and the bonding clamp member 186 are exemplary types of suitable compression grounds that may be utilized in the support assemblies 112 described herein. When the upper clamp member 176 is compressed by the tightening of the nut 200, the protrusions (or spikes) 182 on the upper clamp member 176 are designed to penetrate the non-conductive, anodized layers of the PV modules 102 so as to provide a ground current path (or a current path to ground).

With reference to FIGS. 28 and 29, it can be seen that the bonding clamp member 186 of the third clamp subassembly generally comprises a bottom wall 192, opposed tapered side walls 190 connected to the bottom wall 192, and opposed flange portions 188 connected to the upper ends of the tapered side walls 190. The bottom wall 192 of the bonding clamp member 186 comprises a fastener aperture 194 disposed therethrough for accommodating a fastener (e.g., headless-type assembly bolt 198 with corresponding nut 200). Advantageously, the bonding clamp member 186 has a structural configuration and a material composition that enables the bonding clamp member 186 to accommodate thermal expansion and contraction of one or more PV modules 102. In particular, the bonding clamp member 186 only has protrusions downward into each PV module 102, whereas the top is smooth. This allows for thermal expansion and contraction. The sliding of the bonding clamp member 186 is possible because the upper clamp member 176 is preferably made of stainless steel, and not aluminum which requires the piercing of the anodization layer of the PV module 102. Aluminum has a non-conductive layer, while steel is very conductive.

Also, as best shown in the sectional views of FIGS. 29 and 33, the bottom wall 192 and opposed side wall portions 190 of the bonding clamp member 186 are configured to drop down between the side flanges 106 of adjacent PV modules 102 so as to provide integrated grounding for the PV modules 102 (i.e., the metallic, electrically conductive bonding clamp member 186 helps to establish a current path between PV modules 102 so that conventional grounding, such as a network of copper wire, is not required). Thus, the bonding clamp member 186 reduces material and installation costs associated with the installation of a photovoltaic system or array 100.

In one alternative embodiment, rather than using the headless-type assembly bolt 198 with corresponding nut 200 in the clamp subassemblies described above, a serrated flange hex bolt may be used to hold the components of the clamp assemblies together. Advantageously, the serrated flange hex bolt has a simple configuration and locks into place. Preferably, both the headless-type assembly bolt 198 described above, and the alternative serrated flange hex bolt would be made of a conductive material so as to provide conductivity between the upper clamp members 176, 176' and the pivotal base member 158, 158'.

Advantageously, the pivotal base members 158, 158' of the clamp subassemblies described above swivel or rotate in the concave notches or pockets 130, 144 of the upright support members 120, 134 of the support assembly 112 so as to accommodate a plurality of different tilt angles of one or more PV modules 102, as determined by the sizes of the PV modules 102 and orientation that they are installed (e.g., accommodating PV module tilt angles ranging from approximately four (4) degrees to approximately twelve (12) degrees, inclusive; or ranging between four (4) degrees and twelve (12) degrees, inclusive). During the installation process, the pivotal base members 158, 158' of the clamp subassemblies are simply rotated about their respective clevis pins 196 until the desired PV module tilt angle is achieved.

Figure 31:
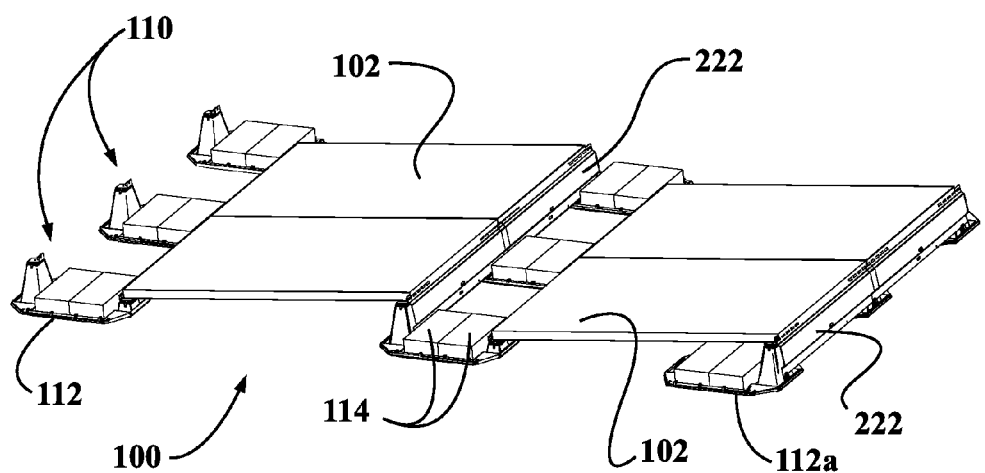
FIG. 31 is yet another perspective view of the alternative version of the array of PV modules shown in FIG. 24 but wherein the northernmost support assemblies are tucked under the northernmost row of PV modules.

In addition, the clamp subassemblies described above are preferably detachably coupled to the first upright support member 120 and/or the second upright support member 134 by a removable pin member (e.g., a removable clevis pin 196) such that the upright portion 172, 172' of the L-shaped flange portions 166, 166' are capable of being disposed near a selected one of opposite sides of one of the first upright support member 120 and the second upright support member 134 (e.g., near either front wall 122 or rear wall 126 of first upright support member 120; or near either front wall 136 or rear wall 140 of second upright support member 134). Advantageously, the removable nature of the clamp subassemblies allows selected ones of the support assemblies 112a to be installed "backwards" on the north row of the PV system or array 100 (refer to FIG. 31, the direction of the northernmost support assemblies 112a are flipped relative to the other support assemblies 112). This permits the northernmost support assemblies 112a to be tucked under the PV modules 102 in the north row to reduce the footprint of the PV array 100, and to enable more PV modules 102 to fit on a rooftop, while also decreasing the wind drag of the system 100.

In one or more embodiments, all of the clamping components (e.g., pivotal base members 158, 158', upper clamp members 176, 176', bonding clamp member 186, bolt 198, nut 200, L-shaped side clamp member 226) described in conjunction with first, second, and third clamp subassemblies are formed from metal so as to enable the clamp components to be both electrically conductive and structurally rigid.

Now, other illustrated features of the base portion 116 of the support assembly 112 will be described. Initially, with reference to FIGS. 17, 18, and 20-22, it can be seen that the base portion 116 comprises integral wire clips 148 for accommodating one or more wires of one or more photovoltaic (PV) modules 102. Advantageously, the wire clips 148 are integrally formed in the base portion 116 (e.g., integrally molded into the plastic of the base portion 116). The integral wire clips 148 are particularly designed for accommodating PV module wires that are running in the north/south direction. As shown in FIGS. 17 and 18, the wire clips 148 are longitudinally spaced apart along the length of the base portion 116 (i.e., from front-to-back). Also, as illustrated in these figures, successive wire clips 148 are arranged in opposite directions (i.e., the wire clips 148 open in opposite directions) so as to securely hold the PV module wires in place. Each wire clip 148 on each side of the base portion 116 is designed to hold two (2) PV module wires, which is enough for connecting PV source circuits. Advantageously, the integral wire clips 148 obviate the need for separate wire clips, thereby reducing both part and labor costs for a PV array installation.

Figure 20:
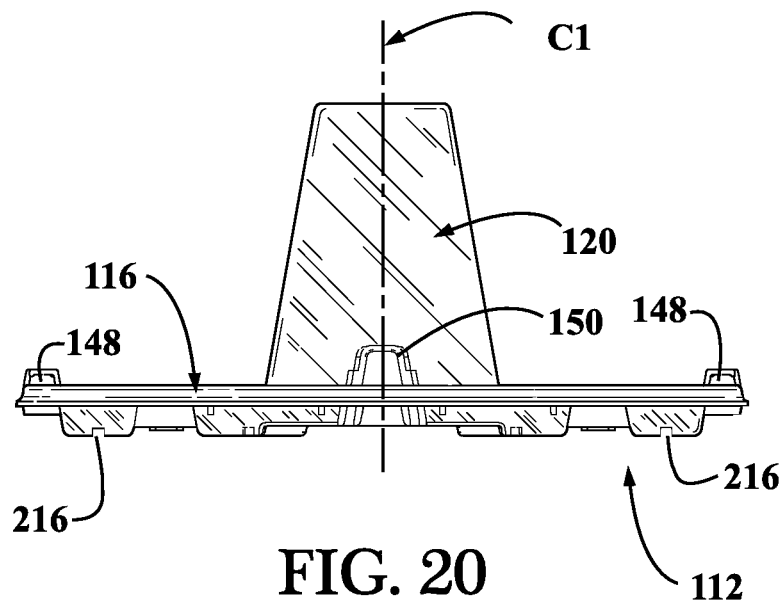
FIG. 20 is a front elevation view of the body portion of the support assembly of FIG. 18.
Figure 22:
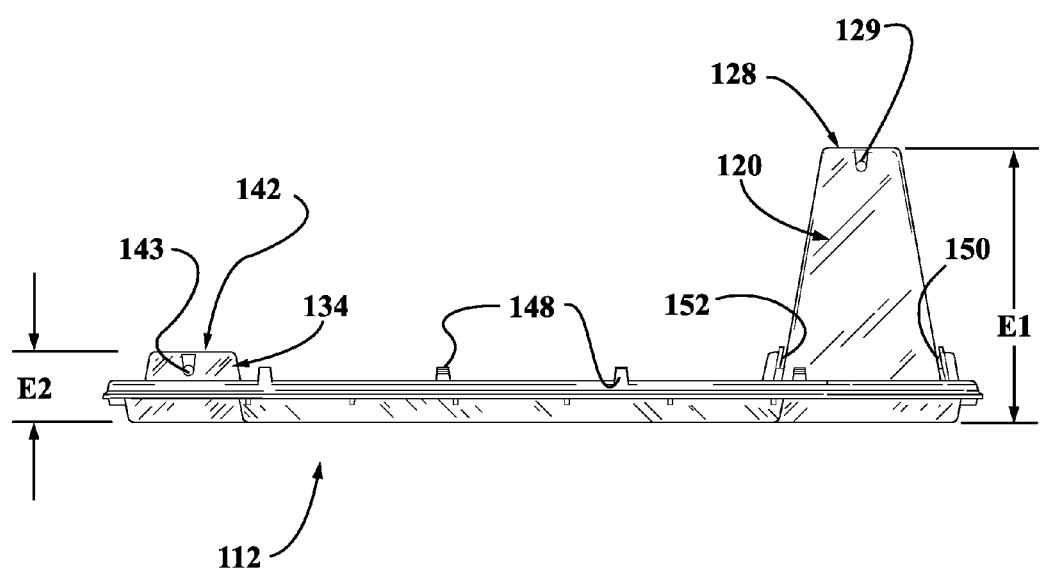
FIG. 22 is a side elevation view of the body portion of the support assembly of FIG. 18.
Figure 23:
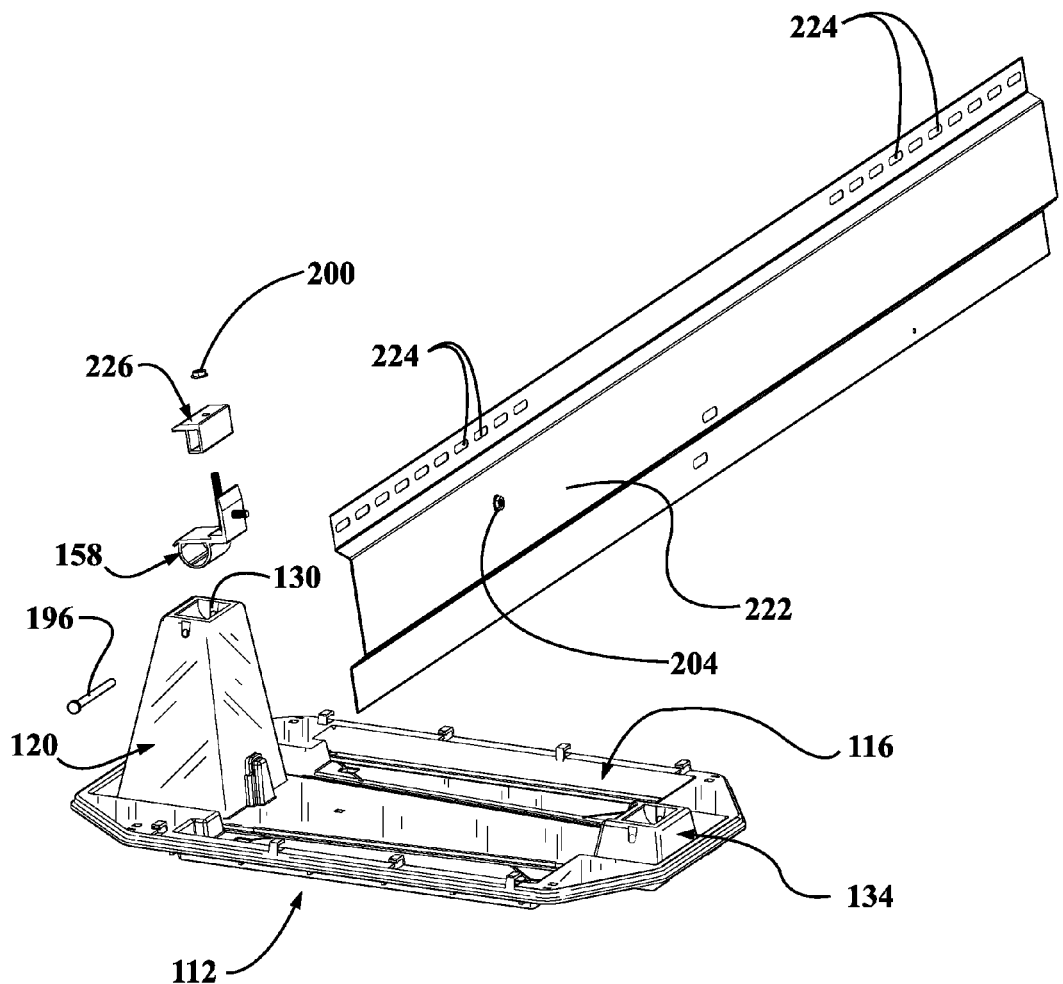
FIG. 23 is an exploded perspective view of one of the support assemblies of FIGS. 14-16 and a wind deflector.

As depicted in FIGS. 18, 20, and 22, the illustrated first upright support member 120 comprises an integrally formed slot 150 in the front wall 122 thereof for receiving an edge of a wind deflector or wind shield (e.g., wind deflector 222 in FIG. 23). Similarly, the opposite, rear wall 126 of the first upright support member 120 also comprises an integrally formed slot 152 formed therein for receiving an edge of a wind deflector (e.g., wind deflector 222). Advantageously, the integrally formed slots 150, 152 enable the bottom edge of a wind deflector 222 to be coupled to the support assembly 112 without a fastener. Because a fastener is only needed at the top of the wind deflector 222, and not at the bottom thereof, the integrally formed slots 150, 152 of the support assembly 112 reduce the requisite number of wind deflector securement fasteners in half, thereby saving material costs and installation labor. Additional details of the wind deflector configuration will be discussed hereinafter.

Figure 19:
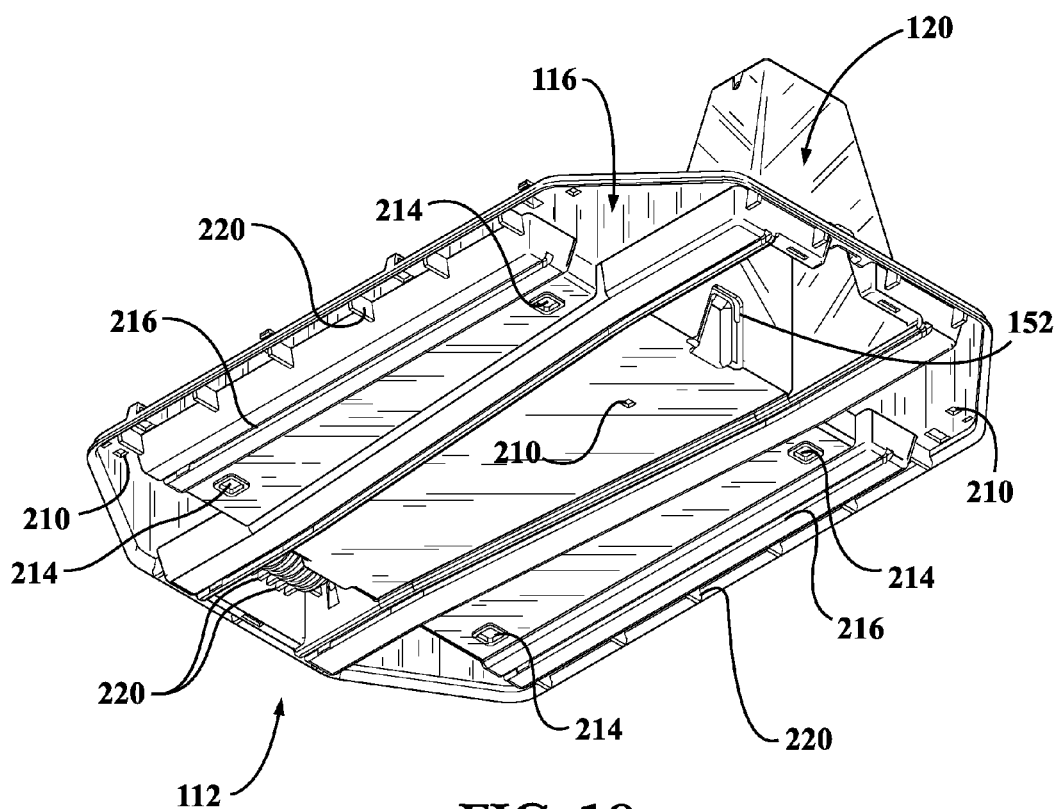
FIG. 19 is a bottom perspective view of the body portion of the support assembly of FIG. 18.
Figure 32:
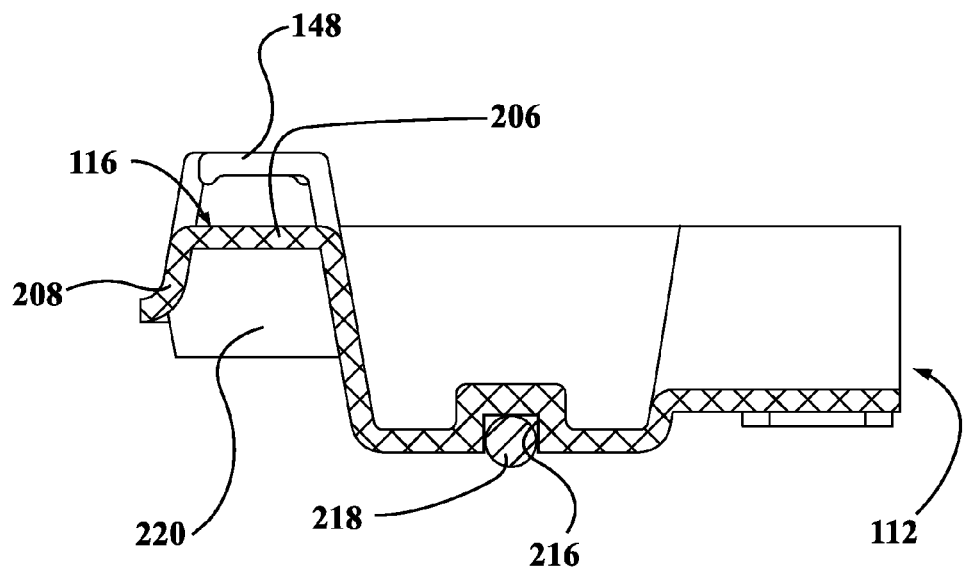
FIG. 32 is a partial sectional view of the base portion of the support assembly illustrating a gasket on the bottom of the base portion, wherein the section is cut along the cutting-plane line C-C in FIG. 17.

In addition, with reference to FIGS. 17, 19, and 32, the illustrated base portion 116 of the support assembly 112 comprises a bottom surface with one or more grooves 216 (see FIGS. 19 and 32) for accommodating one or more respective gaskets or pieces of cord stock 218 (see FIG. 32). In one embodiment, the cord stock may comprise ethylene-propylene-diene monomer (EDPM) cord stock (i.e., EDPM O-rings). Advantageously, the use of the gaskets or pieces of cord stock 218 in the grooves 216 of the base portion 116 increases the grip of the support assembly 112 on the rooftop support surface 108, and it protects the membrane of the rooftop support surface 108 from potential tears. As such, the bottom of the base portion 116 of the support assembly 112 is roof-friendly because it is designed to prevent the roof membrane from being damaged or punctured. In order to further protect the integrity of the roofing membrane, it can be seen in FIGS. 19 and 32 that the bottom of the base portion 116 of the support assembly 112 is generally provided with all rounded surfaces at corners so as to ensure that there are no sharp edges or corners that could tear the roof. The gaskets or pieces of cord stock 218 are low cost and can be installed at the factory, thereby obviating the need for the on-site installation thereof. Also, advantageously the friction fit of the gaskets or pieces of cord stock 218 against the rooftop support surface 108 allows the support assembly 112 to be easily removed at the end of its life cycle for recycling purposes.

Referring to FIGS. 17-19, it can be seen that the illustrated base portion 116 of the support assembly 112 is provided with a plurality of drainage channels 212 and a plurality of weep holes 214 for draining water from the base portion 116. Thus, rain water and other melting precipitation will not collect in the tray-like base portion 116 of the support assembly 112 (i.e., the precipitation will not excessively pool in the recessed portion 118 of the base portion 116). As shown in FIGS. 17 and 18, the drainage channels 212 are generally connected to diagonally opposite corners of each generally square-shaped weep hole 214. However, it is to be understood that other suitable geometries may be used for the weep holes 214 (e.g., circular) and the other suitable configurations can be used for the drainage channels 212.

Figure 21:
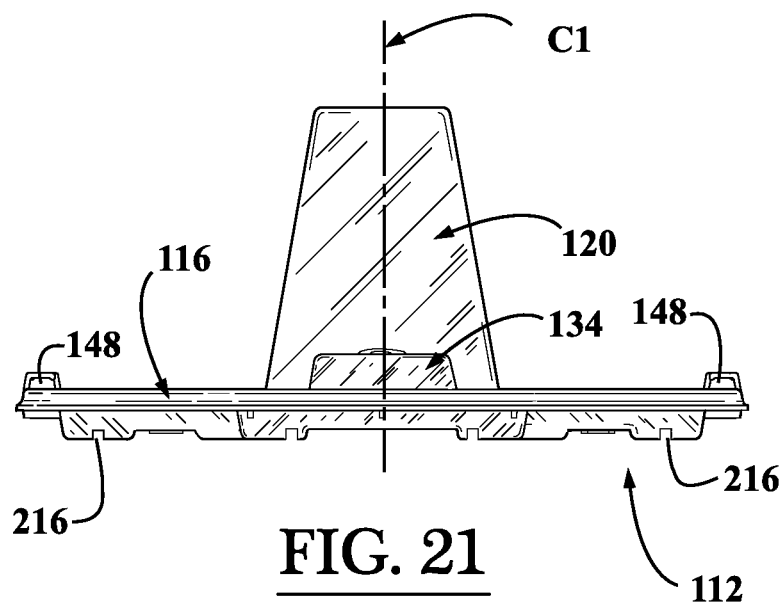
FIG. 21 is a rear elevation view of the body portion of the support assembly of FIG. 18.

As shown in the front and rear views of FIGS. 20 and 21, many of the features of the base portion 116 of the support assembly 112 described above are symmetrically arranged with respect to a centerline C1 disposed in the middle of a transverse profile of the support assembly 112. For example, the wire clips 148 illustrated in FIGS. 20 and 21 are symmetrically arranged with respect to the centerline C1.

While the support assemblies 112 are generally not required to be attached to the rooftop support surface 108 in most installations, nonetheless, the base portion 116 of the illustrated support assembly 112 is provided with a plurality of attachment points 210 (e.g., in the form of square-shaped apertures disposed therethrough—see FIGS. 17-19) for accommodating high wind or seismic installation areas, or for accommodating wireways. In such installations, a lag bolt can be inserted from the bottom, and through one of the attachment points 210. Advantageously, the large bearing surface of the lag bolt is used to prevent spinning while torqueing. An L-shaped bracket, which is commonly used in PV installations, can be tightened onto the top of the part. Custom brackets may also be used.

Similar to that described in conjunction with the third embodiment above, the fourth embodiment also includes rear wind shields or wind deflectors 222 supported by the support assemblies 112 at the rear side of the illustrated PV module rows in order to reduce wind load (see e.g., FIGS. 14, 15, 24, and 31). The illustrated wind deflectors 222 are held by the first upright support members 120 of the support assemblies 112 and are shaped to deflect wind, blowing from the north, up and over the array of PV modules 102 rather than under the PV modules 102 in order to reduce wind load. Referring to the assembled view of FIG. 15 and the exploded view of FIG. 23, it can be seen that the illustrated upper flange of the wind deflector 222 is provided with a plurality of elongated apertures 224 for receiving fasteners (e.g., headless-type bolts 202 described above) which secure the upper flange (upper edge portion) of the wind deflector 222 to the support assemblies 112. The elongated apertures 224 in the upper flange (upper edge portion) of the wind deflector 222 accommodate various PV module or panel widths 102 and accommodate for thermal expansion of the wind deflector 222. Advantageously, as described above, the lower flange (lower edge portion) of the wind deflector 222 is not required to contain any apertures for its securement to the support assemblies 112 because the lower flange (lower edge portion) of the wind deflector 222 merely slips into the wind deflector slot 152 in the rear wall 126 of the first upright support member 120, or alternatively, into the wind deflector slot 150 in the front wall 122 of the first upright support member 120. While the wind deflector 222 is not required in all installations of the PV system 100, it is beneficial for reducing the wind forces exerted on the PV modules 102 and it allows the PV system 100 to be installed in more severe wind areas.

Any of the features or attributes of the above described embodiments and variations can be used in combination with any of the other features and attributes of the above described embodiments and variations as desired.

From the foregoing disclosure it will be apparent that the mounting systems according to the present invention provide improved means for mounting PV modules to flat rooftops and the like. These attributes provide the mounting system with important advantages over competitive products on the market today. These advantages include: it is environmentally friendly, universal and off-the shelf design, no electrical grounding is required, rustproof, and no harm to the roof membrane because it does not penetrate the roof in any way.

From the foregoing disclosure and detailed description of certain preferred embodiments, it will be apparent that various modifications, additions and other alternative embodiments are possible without departing from the true scope and spirit of the present invention. The embodiments discussed were chosen and described to provide the best illustration of the principles of the present invention and its practical application to thereby enable one of ordinary skill in the art to utilize the invention in various embodiments and with various modifications as are suited to the particular use contemplated. All such modifications and variations are within the scope of the present invention as determined by the appended claims when interpreted in accordance with the benefit to which they are fairly, legally, and equitably entitled.

The invention claimed is:

1. A mounting system for photovoltaic modules, the mounting system comprising, in combination:

a plurality of separate support members supporting and orienting the photovoltaic modules in an array, the array including one or more rows of photovoltaic modules, at least one of the one or more rows of photovoltaic modules comprising two photovoltaic modules disposed adjacent to one another;

wherein each of the photovoltaic modules is supported by at least four of the support members, and each of the photovoltaic modules comprises first and second outer lateral edges defining the east-west extents of each photovoltaic module; and wherein each of the support members is secured to and supports only one of the photovoltaic modules in each of the one or more rows of photovoltaic modules, and at least one of the support members is spaced inwardly from the first outer lateral edge of at least one of the photovoltaic modules by a first distance and at least another of the support members is spaced inwardly from the second outer lateral edge of the at least one of the photovoltaic modules by a second distance.

2. The mounting system according to claim 1, wherein the support members are coupled to mounting holes of the photovoltaic modules.

3. The mounting system according to claim 1, wherein the support members are secured to the photovoltaic modules with clamps.

4. The mounting system according to claim 1, further comprising integrated grounding means, the integrated grounding means configured to provide integrated grounding between adjacent photovoltaic modules.

5. The mounting system according to claim 1, further comprising a ballast receiving portion, the ballast receiving portion configured to accommodate one or more ballasts.

6. A support member for supporting one or more photovoltaic modules on a support surface, the support member comprising:

a body portion, the body portion including a ballast receiving portion for accommodating one or more ballasts, the body portion further including a first support portion with a first surface and a second support portion with a second surface, the first support portion being spaced apart from the second support portion by the ballast receiving portion, at least one of the first support portion and the second support portion of the body portion of the support member being hollow with spaced-apart wall portions bounding a central cavity;

wherein the support member is configured to bridge a plurality of rows of photovoltaic modules, the first surface of the support member being configured to support one or more photovoltaic modules in a first row of the plurality of rows of photovoltaic modules, and the second surface of the support member being configured to support one or more photovoltaic modules in a second row of the plurality of rows of photovoltaic modules.

7. The support member according to claim 6, wherein the body portion of the support member comprises plastic.

8. The support member according to claim 6, wherein at least one of the first surface and the second surface is sloped so as to accommodate an angled mounting of the one or more photovoltaic modules.

9. The support member according to claim 6, wherein the first surface of the first support portion is disposed at a higher elevation relative to the support surface than the second surface of the second support portion.

10. The support member according to claim 6, wherein at least one of the first surface and the second surface comprises a spacing projection that is configured to be disposed between adjacent ones of the one or more photovoltaic modules in the first row or second row.

11. The support member according to claim 6, wherein the support member is sized and shaped to nest together with one or more other support members in a stack for shipping and storage.

12. The support member according to claim 6, further comprising a clamp assembly with one or more clamping elements configured to secure the one or more photovoltaic modules to the body portion of the support member.

13. The support member according to claim 12, wherein the clamp assembly further includes a fastener member coupling the one or more clamping elements to the body portion of the support member.

14. The support member according to claim 6, further comprising integrated grounding means, the integrated grounding means configured to provide integrated grounding between adjacent photovoltaic modules.

15. A photovoltaic system mounted on a support surface, the system comprising, in combination:
  a plurality of rectangular-shaped photovoltaic modules;
  a plurality of separate and spaced-apart support members supporting and orienting the photovoltaic modules in an array on the support surface without penetrating the support surface, the array including a plurality of rows of photovoltaic modules, each of the support members having a body portion, the body portion including a ballast receiving portion for accommodating one or more ballasts, the body portion further including at least one hollow support structure coupled to the ballast receiving portion, and at least one of the plurality of support members further including integrated grounding means, the integrated grounding means configured to provide integrated grounding between adjacent photovoltaic modules, the body portion of at least one of the support members further including a first support portion with a first surface and a second support portion with a second surface, the first support portion being spaced apart from the second support portion by the ballast receiving portion;
  wherein at least one of the plurality of support members bridges a first row of the plurality of rows of photovoltaic modules and a second row of the plurality of rows of photovoltaic modules; and
  wherein the first surface of the at least one of the plurality of support members supports one or more photovoltaic modules in the first row of the plurality of rows of photovoltaic modules, and the second surface of the at least one of the plurality of support members supports one or more photovoltaic modules in the second row of the plurality of rows of photovoltaic modules.

16. The photovoltaic system according to claim 15, wherein the body portion of at least one of the plurality of support members comprises plastic.

17. The photovoltaic system according to claim 15, wherein at least one of the plurality of support members further comprises a clamp assembly with one or more clamping elements that secure one or more photovoltaic modules to the body portion of the support member.

18. The photovoltaic system according to claim 15, wherein the first surface of the first support portion of at least one of the plurality of support members is disposed at a higher elevation relative to the support surface than the second surface of the second support portion of the at least one of the plurality of support members.

19. A photovoltaic system mounted on a support surface, the system comprising, in combination:
  a plurality of rectangular-shaped photovoltaic modules;
  a plurality of separate and spaced-apart support members supporting and orienting the photovoltaic modules in an array on the support surface without penetrating the support surface, the array including a plurality of rows of photovoltaic modules, each of the support members having a body portion, the body portion including a ballast receiving portion for accommodating one or more ballasts, at least one of the plurality of support members further including integrated grounding means, the integrated grounding means configured to provide integrated grounding between adjacent photovoltaic modules, and the body portion of at least one of the support members further including a first support portion with a first surface and a second support portion with a second surface, the first support portion being spaced apart from the second support portion by the ballast receiving portion, and the first and second support portions being integrally formed with the ballast receiving portion;
  wherein at least one of the plurality of support members bridges a first row of the plurality of rows of photovoltaic modules and a second row of the plurality of rows of photovoltaic modules; and
  wherein the first surface of the at least one of the plurality of support members supports one or more photovoltaic modules in the first row of the plurality of rows of photovoltaic modules, and the second surface of the at least one of the plurality of support members supports one or more photovoltaic modules in the second row of the plurality of rows of photovoltaic modules.

20. The photovoltaic system according to claim 19, wherein the ballast receiving portion is configured to accommodate one or more ballasts laying generally flat relative to the support surface.

\* \* \* \* \*